United States Patent
Brun et al.

(10) Patent No.: US 11,791,388 B2
(45) Date of Patent: Oct. 17, 2023

(54) SOURCE LEAKAGE CURRENT SUPPRESSION BY SOURCE SURROUNDING GATE STRUCTURE

(71) Applicant: Taiwan Semiconductor Manufacturing Co., Ltd., Hsin-Chu (TW)

(72) Inventors: Aurelien Gauthier Brun, Hsin-Chu (TW); Chun Lin Tsai, Hsin-Chu (TW); Jiun-Lei Jerry Yu, Zhudong Township (TW); Po-Chih Chen, Hsinchu (TW); Yun-Hsiang Wang, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 80 days.

(21) Appl. No.: 16/862,875

(22) Filed: Apr. 30, 2020

(65) Prior Publication Data
US 2021/0273065 A1 Sep. 2, 2021

Related U.S. Application Data

(60) Provisional application No. 62/982,499, filed on Feb. 27, 2020.

(51) Int. Cl.
*H01L 29/417* (2006.01)
*H01L 29/423* (2006.01)
(Continued)

(52) U.S. Cl.
CPC .... *H01L 29/41775* (2013.01); *H01L 21/0254* (2013.01); *H01L 21/32133* (2013.01);
(Continued)

(58) Field of Classification Search
CPC .......... H01L 21/0254; H01L 21/32133; H01L 29/2003; H01L 29/205; H01L 29/41775;
(Continued)

(56) References Cited

U.S. PATENT DOCUMENTS 7,465,997 B2* 12/2008 Kinzer .............. H01L 29/41758
257/401
7,550,821 B2* 6/2009 Shibata ................... H01L 24/05
257/615
(Continued)

OTHER PUBLICATIONS

Efthymiou et al. "On the Physical Operation and Optimization of the p-GaN Gate in Normally-off GaN HEMT Devices." Appl. Phys. Lett. 110, 123502 (2017), published on Mar. 8, 2017.
(Continued)

*Primary Examiner* — Jay C Kim
(74) *Attorney, Agent, or Firm* — Eschweiler & Potashnik, LLC

(57) ABSTRACT

In some embodiments, the present disclosure relates to a transistor device. The transistor device that includes a source contact disposed over a substrate. The source contact has a first side and an opposing second side disposed between a first end and an opposing second end. A drain contact is disposed over the substrate and is separated from the source contact along a first direction. A gate structure is disposed over the substrate between the source contact and the drain contact. The gate structure extends along the first side of the source contact facing the drain contact and also wraps around the first end and the opposing second end of the source contact.

20 Claims, 16 Drawing Sheets

(51) Int. Cl.
*H01L 29/778* (2006.01)
*H01L 29/205* (2006.01)
*H01L 21/3213* (2006.01)
*H01L 21/02* (2006.01)
*H01L 29/20* (2006.01)
*H01L 29/66* (2006.01)

(52) U.S. Cl.
CPC ........ *H01L 29/2003* (2013.01); *H01L 29/205* (2013.01); *H01L 29/42316* (2013.01); *H01L 29/66462* (2013.01); *H01L 29/7786* (2013.01)

(58) Field of Classification Search
CPC ......... H01L 29/42316; H01L 29/66462; H01L 29/7786
See application file for complete search history.

(56) References Cited

U.S. PATENT DOCUMENTS

| | | | | |
|---|---|---|---|---|
| 8,198,653 B2* | 6/2012 | Imada | ................ | H01L 29/34 257/194 |
| 8,890,239 B2* | 11/2014 | Yaegashi | ........... | H01L 29/41741 257/330 |
| 9,379,231 B2* | 6/2016 | Briere | ............... | H01L 29/42316 |
| 9,461,158 B2* | 10/2016 | Fujii | ................ | H01L 29/41758 |
| 9,859,411 B2* | 1/2018 | Suzuki | ............. | H01L 29/41758 |
| 9,882,041 B1* | 1/2018 | Joh | ..................... | H01L 29/0649 |
| 9,911,843 B2* | 3/2018 | Umeda | .................. | H01L 29/78 |
| 9,941,400 B2* | 4/2018 | Zhang | .................. | H01L 23/481 |
| 10,038,064 B2* | 7/2018 | Tanaka | ............. | H01L 29/66462 |
| 10,529,802 B2* | 1/2020 | Mizan | ................. | H01L 29/205 |
| 10,672,876 B2* | 6/2020 | Tanimoto | ........... | H01L 29/7787 |
| 10,868,167 B2* | 12/2020 | Umeda | ................ | H01L 29/0661 |
| 10,879,168 B2* | 12/2020 | Hill | ................... | H01L 29/41758 |
| 11,171,227 B2* | 11/2021 | Chang | ................ | H01L 21/7605 |
| 11,195,945 B2* | 12/2021 | Lin | .................... | H01L 29/7786 |
| 2002/0167047 A1 | 11/2002 | Yasuhara et al. | | |
| 2003/0038316 A1 | 2/2003 | Tsuchiko et al. | | |
| 2005/0189561 A1* | 9/2005 | Kinzer | ............... | H01L 29/7787 257/192 |
| 2006/0138456 A1 | 6/2006 | Parikh et al. | | |
| 2006/0145189 A1 | 7/2006 | Beach | | |
| 2012/0012908 A1* | 1/2012 | Matsunaga | .......... | H01L 27/088 257/296 |
| 2013/0214330 A1* | 8/2013 | Briere | ................ | H01L 29/7788 257/194 |
| 2013/0240897 A1* | 9/2013 | Imada | ............... | H01L 29/66431 257/194 |
| 2015/0179741 A1 | 6/2015 | Umeda et al. | | |
| 2017/0278961 A1 | 9/2017 | Hill et al. | | |
| 2021/0265473 A1* | 8/2021 | Yamaguchi | .......... | H01L 29/802 |

OTHER PUBLICATIONS

Coates, Eric. "Field Effect Transistors—The Depletion Mode MOSFET." Retrieved from https://learnabout-electronics.org/fet_05.php Published on Aug. 18, 2017.

Baek et al. "Suppression Techniques of Subthreshold Hump Effect for High-Voltage MOSFET." Journal of Semiconductor Technology and Science, vol. 13, No .5, Oct. 2013.

* cited by examiner

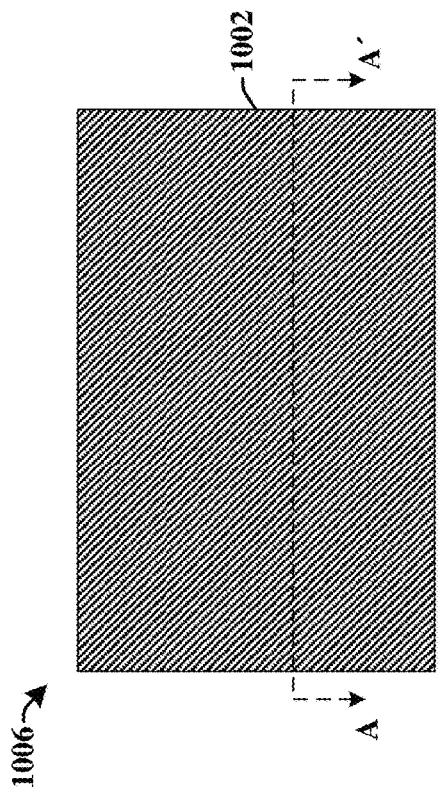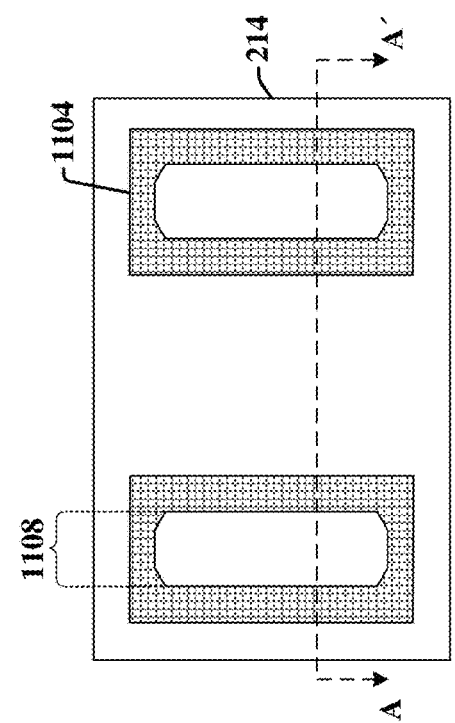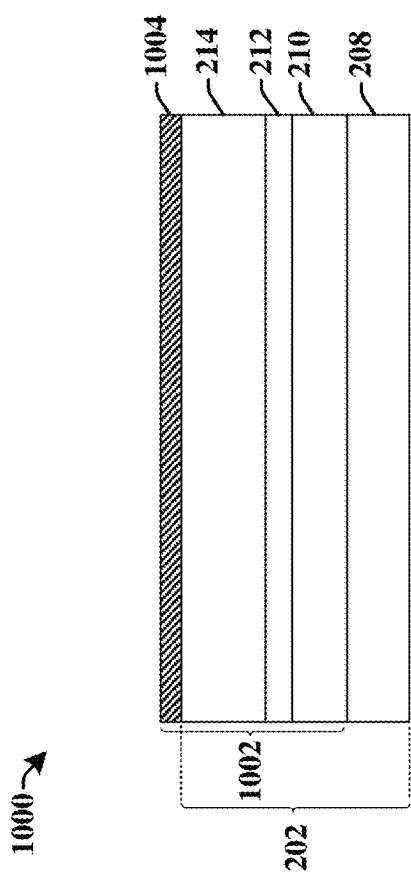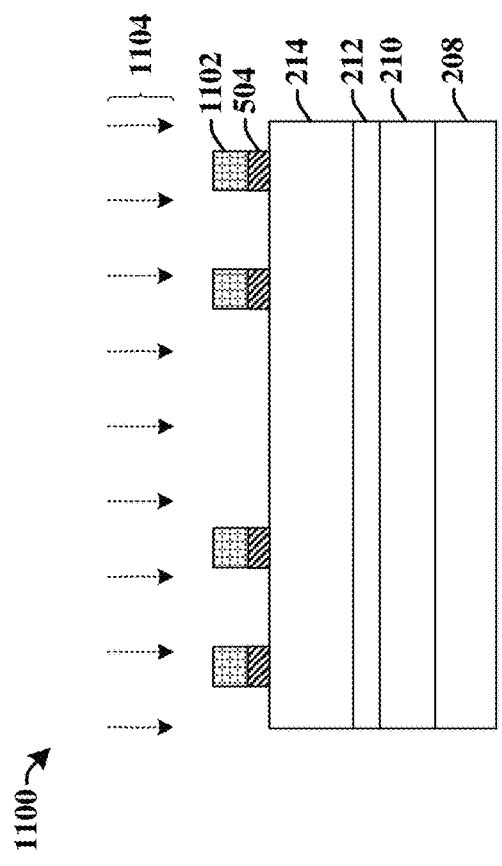
Fig. 10A  Fig. 10B
Fig. 11A  Fig. 11B

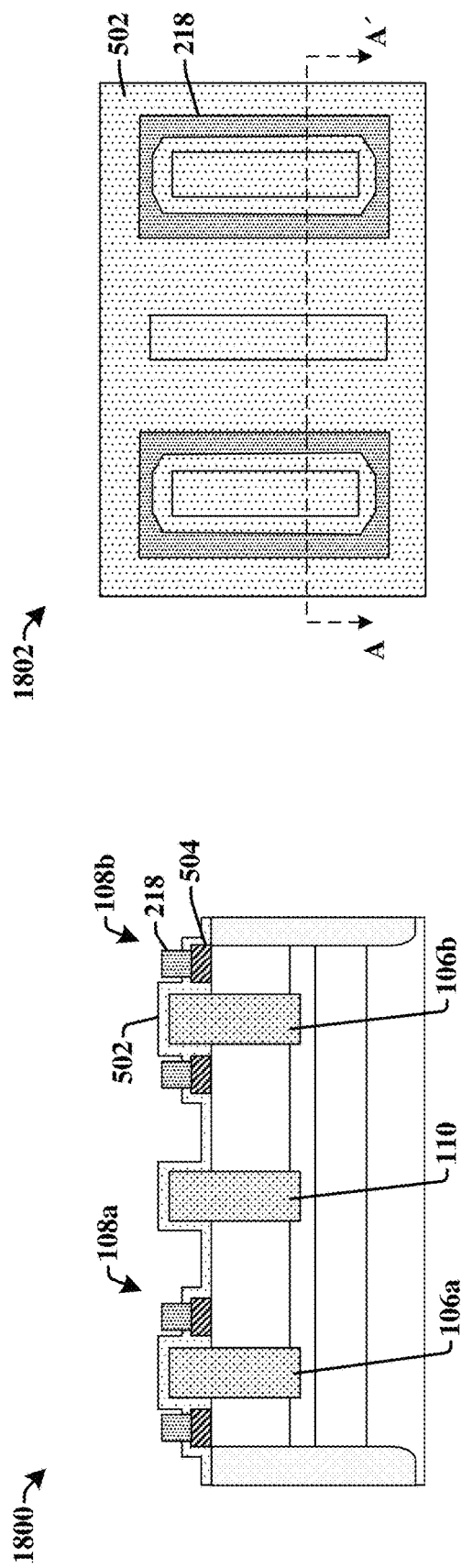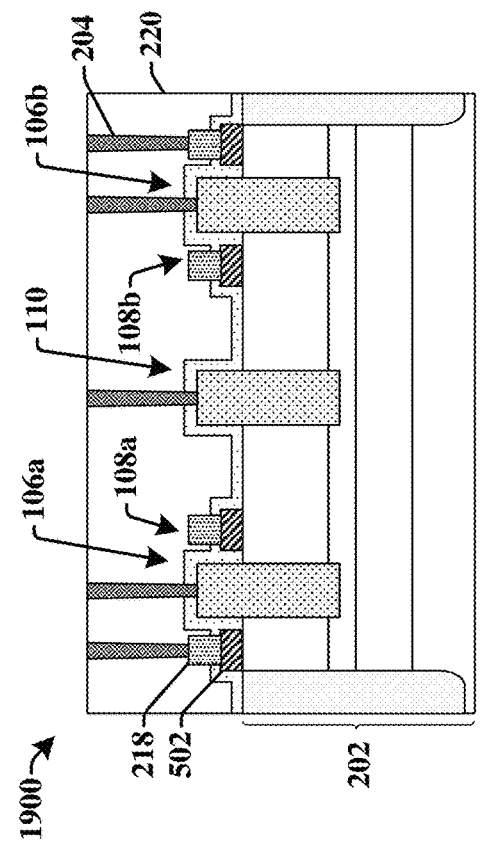
Fig. 18A
Fig. 18B
Fig. 19

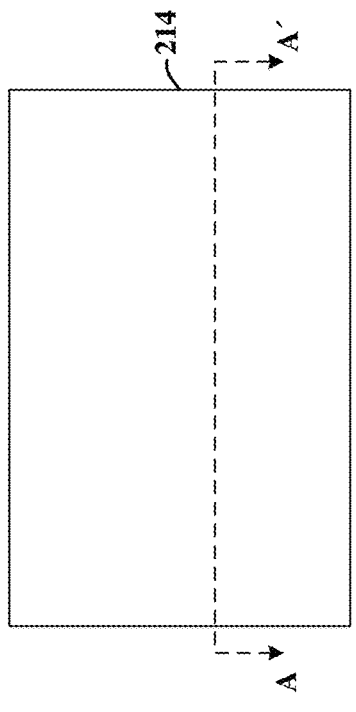
Fig. 21A
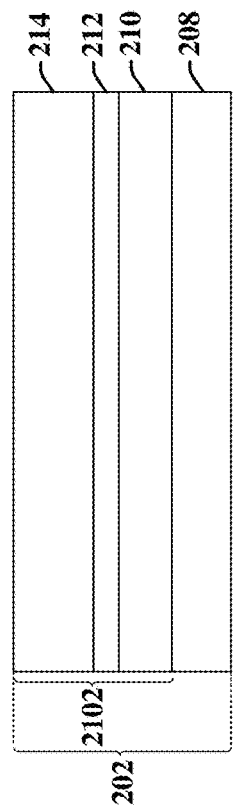
Fig. 21B
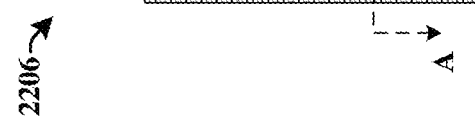
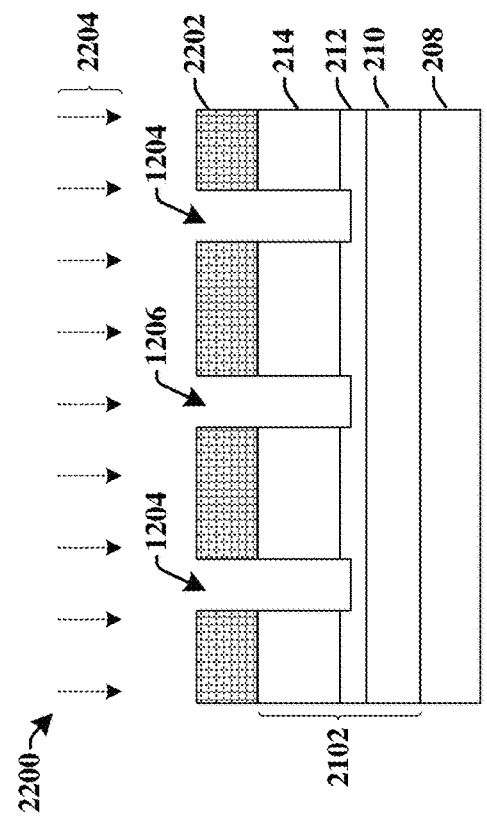
Fig. 22A
Fig. 22B

SOURCE LEAKAGE CURRENT SUPPRESSION BY SOURCE SURROUNDING GATE STRUCTURE

REFERENCE TO RELATED APPLICATION

This application claims the benefit of U.S. Provisional Application No. 62/982,499, filed on Feb. 27, 2020, the contents of which are hereby incorporated by reference in their entirety.

BACKGROUND

Modern day integrated chips comprise millions or billions of transistor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers for RF transmission/receiving chains due to their ability to handle high breakdown voltages (e.g., greater than about 50V) and high frequencies. High voltage devices are also used in power management integrated circuits, automotive electronics, sensor interfaces, flat panel display driver applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-19 illustrate some embodiments of a method of forming an integrated chip having a high electron mobility (HEMT) device comprising a gate structure configured to suppress a leakage current between source and drain contacts.

FIGS. 21A-27 illustrate some embodiments of a method of forming an integrated chip having a MISFET (metal-insulator-semiconductor field-effect-transistor) device comprising a gate structure configured to suppress a leakage current between source and drain contacts.

DETAILED DESCRIPTION

Figure 1:
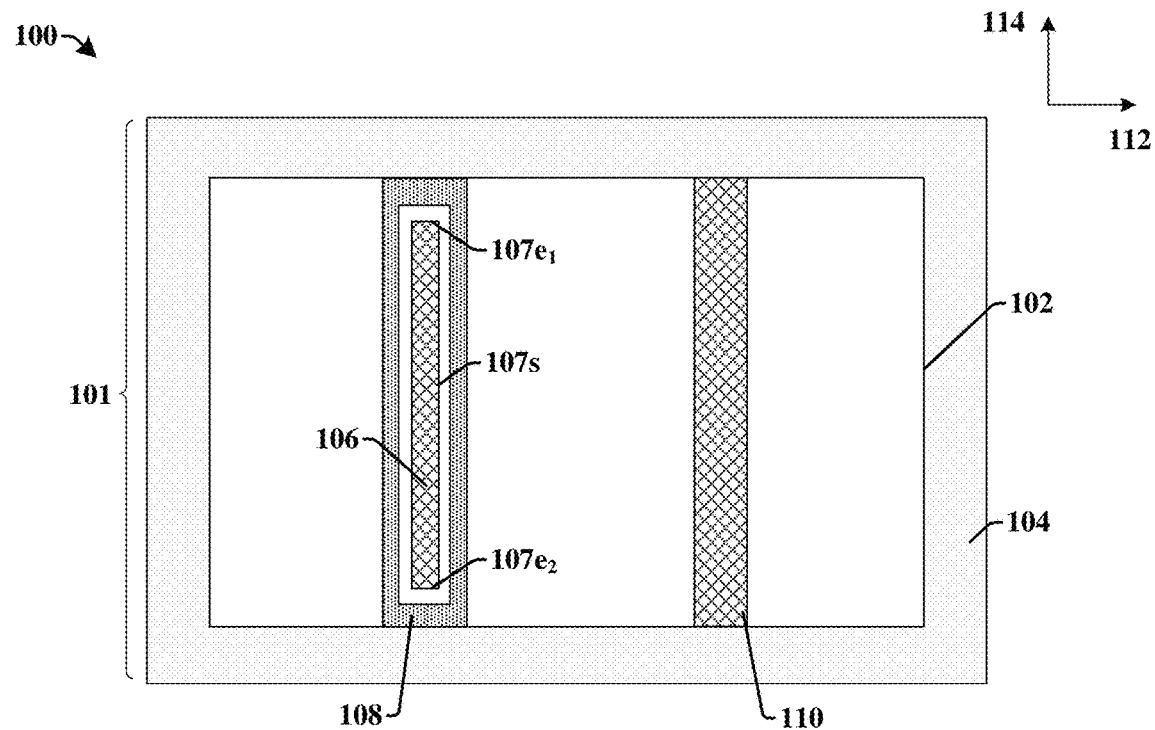
FIG. 1 illustrates a top-view of some embodiments of an integrated chip having a transistor device comprising a gate structure configured to suppress a leakage current between source and drain contacts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-voltage transistor devices are used in many modern day electronic devices. One popular type of high voltage transistor device is a high electron mobility transistor (HEMT) device. HEMT devices comprise a plurality of semiconductor layers stacked over a base substrate. The plurality of semiconductor layers include an active layer and a barrier layer that contacts an upper surface of the active layer to form a heterojunction at their interface. A two-dimensional electron gas (2DEG) is inherently present at the heterojunction between the active layer and the barrier layer. Because a 2DEG is inherently present between the active layer and the barrier layer, electrons are able to move freely along the interface A HEMT device may comprise an active area surrounded by an isolation region having a damaged crystalline lattice. The damaged crystalline lattice confines a 2DEG to within the active area by disrupting the 2DEG and mitigating movement of electrons. A source contact and a drain contact are disposed over the active area. To prevent unwanted currents from flowing between the source contact and the drain contact (i.e., to form a device in a "normally off" mode), a gate structure comprising a doped semiconductor device (e.g., p-doped gallium nitride (GaN)) may be disposed within the active area between the source contact and the drain contact. A gate structure comprising a doped semiconductor device is able to interrupt the underlying 2DEG and prevent electrons from moving freely under the gate structure.

The gate structure may extend over an entire width of the active area as an elongated or rectangular shaped 'gate finger', so as to block the movement of electrons between the source contact and the drain contact. However, it has been appreciated that the isolation region does not provide complete isolation, and that there may be unwanted leakage currents that flow around ends of a gate finger and through an isolation region. The unwanted leakage currents can result in a sub-threshold hump in a drain current vs. gate voltage relation in a HEMT device. The sub-threshold hump has a number of negative consequences, such as higher power consumption and being difficult to model (e.g., in SPICE curve fitting and/or parameter extraction). Furthermore, the leakage currents provide for an undesirable source current when the device is turned off (e.g., a current measured at a source contact when a voltage is being applied to the drain with a gate voltage of 0V), thereby increasing power consumption.

The present disclosure, in some embodiments, relates to an integrated chip having a semiconductor device comprising a gate structure that wraps around a source contact to reduce leakage currents between the source contact and a drain contact of a transistor device (e.g., a two-dimensional electron gas base transistor device). In some embodiments, the semiconductor device comprises a source contact and a drain contact disposed over a substrate. A gate structure is disposed over the substrate between the source contact and the drain contact. The gate structure extends along a first side of the source contact facing the drain region. The gate structure also wraps around opposing ends of the source contact. Because the gate structure is able to disrupt an underlying 2DEG within the substrate, having the gate structure wrap around opposing ends of the source contact mitigates leakage currents around ends of the gate structure.

FIG. 1 illustrates a top-view of some embodiments of an integrated chip 100 having a semiconductor device comprising a gate structure configured to suppress a leakage current between source and drain contacts (i.e., a source leakage current).

The integrated chip 100 comprises a substrate 101 having an active area 102 surrounded by an isolation region 104. In some embodiments, the active area 102 may comprise one or more semiconductor material such as gallium, germanium, silicon, or the like. In some embodiments, the isolation region 104 may comprise one or more semiconductor materials (e.g., gallium, germanium, silicon, or the like) that have crystalline damage that disrupts an underlying two dimensional electron gas (2DEG). A source contact 106 and a drain contact 110 are disposed over the active area 102. The source contact 106 and the drain contact 110 are separated along a first direction 112. A gate structure 108 is arranged over the active area 102 and between the source contact 106 and the drain contact 110 along the first direction 112. In some embodiments, the gate structure 108 is not arranged between the source contact 106 and a drain contact along a second direction 114, which is perpendicular to the first direction 112. In such embodiments, the drain contact does not laterally overlap the source contact 106 along the first direction or completely surround the source contact 106.

The gate structure 108 extends in the second direction 114 along a first side 107s of the source contact 106 and past opposing ends, 107$e_1$ and 107$e_2$, of the source contact 106. The gate structure 108 also extends in the first direction 112 past opposing sides of the source contact 106, so that the gate structure 108 wraps around three or more sides of the source contact 106. Because the gate structure 108 wraps around three or more sides of the source contact 106, a line extending through the source contact 106 intersects the gate structure 108 along opposing sides of the source contact 106. In some embodiments, the gate structure 108 continuously extends around the source contact 106 in a closed and unbroken path. In other embodiments (not shown), the gate structure 108 does not extend completely around the source contact 106.

Because the gate structure 108 wraps around the source contact 106, the gate structure 108 is able to disrupt an underlying 2DEG along a continuous path that encloses the opposing ends, 107$e_1$ and 107$e_2$, of the source contact 106. By disrupting the 2DEG along a continuous path that encloses the opposing ends, 107$e_1$ and 107$e_2$, of the source contact 106, a leakage current between the source contact 106 and the drain contact 110 is reduced.

Figure 2A:
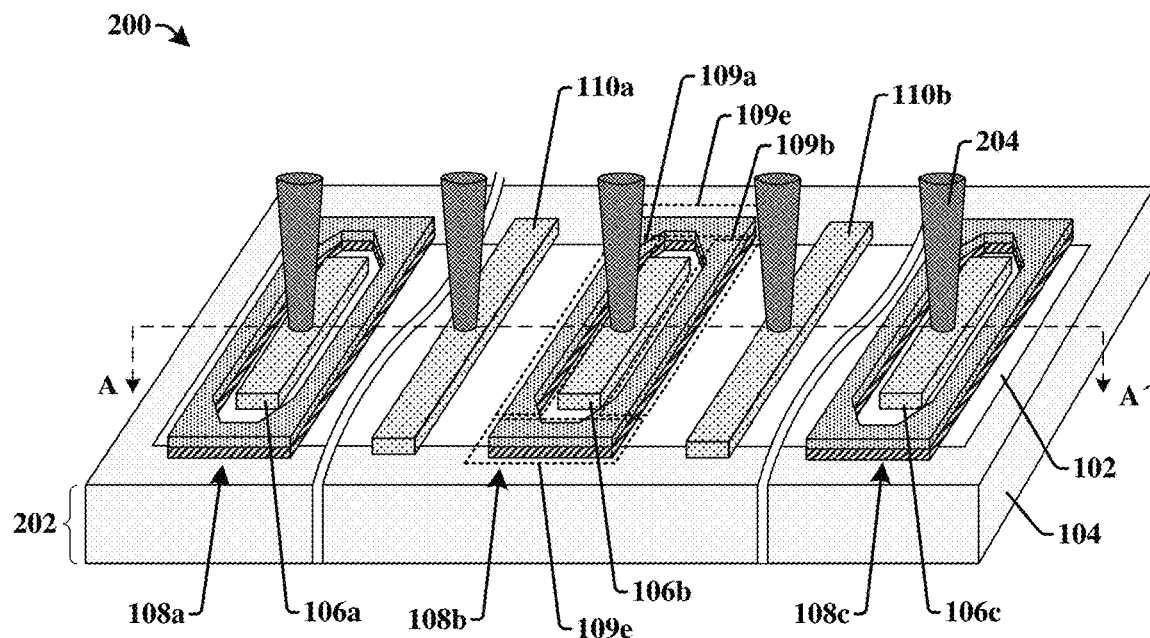
FIGS. 2A-2B illustrate some additional embodiments of an integrated chip having a transistor device comprising a gate structure configured to suppress a leakage current between source and drain contacts.

FIG. 2A illustrates a three-dimensional view of an integrated chip 200 having a transistor device comprising a gate structure configured to suppress a leakage current between source and drain contacts.

The integrated chip 200 comprises an active area 102 disposed within a stacked substrate structure 202 and surrounded by an isolation region 104. A plurality of source contacts 106a-106c, a plurality of gate structures 108a-108c, and a plurality of drain contacts 110a-110b are disposed over the active area 102. For example, a first source contact 106a and a second source contact 106b are disposed within the active area 102 and on opposing sides of a first drain contact 110a. A first gate structure 108a is arranged between the first source contact 106a and the first drain contact 110a and a second gate structure 108b is arranged between the second source contact 106b and the first drain contact 110a. A second drain contact 110b is disposed within the active area 102 between the second source contact 106b and a third source contact 106c. A third gate structure 108c is arranged between the second drain contact 110b and the third source contact 106c.

The second gate structure 108b comprises a first gate line segment 109a disposed between the first drain contact 110a and the second source contact 106b and a second gate line segment 109b disposed between the second source contact 106b and the second drain contact 110b. The first gate line segment 109a is configured to control charge carriers between the first drain contact 110a and the second source contact 106b and second gate line segment 109b is configured to control charge carriers between the second source contact 106b and the second drain contact 110b. The first gate line segment 109a and the second gate line segment 109b are coupled together by end segments 109e extending in a direction that is perpendicular to the gate line segments 109a-109b. In some embodiments, the first gate line segment 109a, the second gate line segment 109b, and the end segments 109e form a closed loop around the second source contact 106b. Although the transistor device shown in FIG. 2A is illustrated as having three gate structures it will be appreciated that in various embodiments, a disclosed transistor device may comprise tens, hundreds, or thousands of gate structures, source contacts, and drain contacts that are disposed over an active area.

The plurality of source contacts 106a-106c are electrically coupled together by way of one or more interconnect layers (not shown) within a back-end-of-the-line (BEOL) interconnect structure disposed over the stacked substrate structure 202. Similarly, the plurality of gate structures 108a-108c and the plurality of drain contacts 110a-110b are also electrically coupled together by way of one or more interconnect layers disposed over the stacked substrate structure 202. In some embodiments, the BEOL interconnect structure may comprise conductive contacts 204 disposed on the plurality of source contacts 106a-106c and the plurality of drain contacts 110a-110b. In some additional embodiments (not shown), the BEOL interconnect structure may further comprise conductive contacts disposed on the plurality of gate structures 108a-108c. In various embodiments, the conductive contacts may be disposed at different locations on the plurality of gate structures 108a-108c. For example, in some embodiments, the conductive contacts may be disposed on the plurality of gate structures 108a-108c directly between the plurality of source contacts 106a-106c and the plurality of drain contacts 110a-110b (e.g., on the first gate line segment 109a or the second gate line segment 109b), while in other embodiments the conductive contacts may be disposed on the plurality of gate structures 108a-108c directly between the plurality of source contacts 106a-106c and the isolation region 104 (e.g., on an end segment 109e). In some embodiments, a single conductive contact may be disposed on a gate structure (e.g., second gate structure 108b) extending along opposing sides of a source contact (e.g., second source contact 106b).

Because the plurality of source contacts 106a-106c, the plurality of drain contacts 110a-110b, and the plurality of gate structures 108a-108c are respectively electrically coupled together, the plurality of source contacts 106a-106c, the plurality of drain contacts 110a-110b, and the plurality of gate structures 108a-108c operate as a single transistor device. For example, during operation, the first gate structure 108a is biased to allow charges to flow from the first source contact 106a to the first drain contact 110a and the second gate structure 108b is biased to allow charges to flow from the second source contact 106b to the first drain contact 110a.

The first gate structure 108a wraps around the first source contact 106a, and the second gate structure 108b wraps around the second source contact 106b. For example, the first gate structure 108a extends past opposing sides of the first source contact 106a along perpendicular directions and the second gate structure 108b also extends past opposing sides of the second source contact 106b along perpendicular directions. In some embodiments, the first gate structure 108a and the second gate structure 108b respectively have inner sidewalls that are separated from the first source contact 106a and the second source contact 106b by non-zero distances.

Figure 2B:
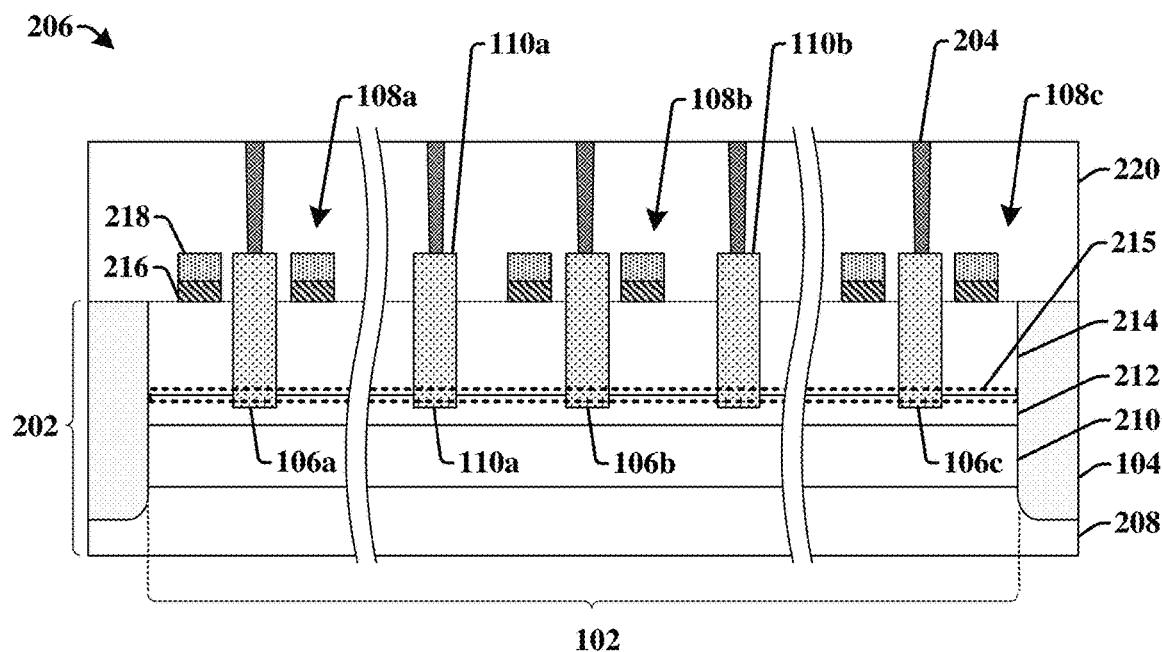

FIG. 2B illustrates a cross-sectional view 206 of the integrated chip 200 of FIG. 2A. As shown in cross-sectional view 206, the stacked substrate structure 202 comprises an active layer 212 disposed over a base substrate 208 and a barrier layer 214 disposed over the active layer 212. In some embodiments, a buffer layer 210 may be disposed between the active layer 212 and the base substrate 208 to improve lattice matching between the base substrate 208 and the active layer 212. The active layer 212 and the barrier layer 214 meet at an interface that defines a heterojunction in which a two-dimensional electron gas (2DEG) 215 is present. In various embodiments, the base substrate 208 may comprise silicon, silicon carbide, sapphire, or the like. In some embodiments, the active layer 212 may comprise gallium nitride (GaN), gallium arsenide (GaAs), or the like. In some embodiments, the barrier layer 214 may comprise aluminum gallium nitride (AlGaN), aluminum gallium arsenide (AlGaAs), or the like. In some embodiments, the buffer layer 210 may comprise GaN (having different concentrations of Ga and N than the active layer 212), GaAs (having a different concentrations of Ga and As than the active layer 212), or the like.

An active area 102 is disposed within the stacked substrate structure 202. The active area 102 is surrounded by an isolation region 104. In some embodiments, the isolation region 104 may comprise a region of the stacked substrate structure 202 in which crystalline structures of one or more layers of the stacked substrate structure 202 are damaged (e.g., by way of an ion implantation process). The crystalline damage within the one or more layers disrupts the 2DEG 215, so as to prevent the 2DEG 215 from extending into the isolation region 104. The plurality of source contacts 106a-106c, the plurality of gate structures 108a-108c, and the plurality of drain contacts 110a-110b are disposed within the active area 102 over the barrier layer 214.

In some embodiments, the plurality of gate structures 108a-108c respectively comprise a lower gate layer 216 and a gate contact 218 over the lower gate layer 216. Both the lower gate layer 216 and the gate contact 218 within a gate structure wrap around one of the plurality of source contacts 106a-106c. In various embodiments, the gate contact 218 may comprise a metal, such as aluminum, cobalt, titanium, tungsten, or the like. In some embodiments, the transistor device is a high electron mobility transistor (HEMT) device and the lower gate layer 216 is a doped semiconductor material, such as p-doped gallium nitride, for example. The doped semiconductor material allows the plurality of gate structures 108a-108c to interrupt the underlying 2DEG 215 so as to form a "normally-off" device. In other embodiments, the transistor device is a metal-insulator-semiconductor field-effect-transistor (MISFET) device and the lower gate layer 216 is an insulating material, such as silicon dioxide, silicon nitride, or the like.

An inter-level dielectric (ILD) layer 220 is disposed over the stacked substrate structure 202. The conductive contacts 204 extend through the ILD layer 220 to contact the plurality of source contact 106a-106c, the plurality of gate structures 108a-108c, and the plurality of drain contacts 110a-110b. In some embodiments (not shown), additional interconnect layers (e.g., interconnect wires and/or interconnect vias) may be disposed within additional ILD layers over the ILD layer 220. The additional interconnect layers may be configured to electrically couple the plurality of source contact 106a-106c, to electrically couple the plurality of gate structures 108a-108c, and to electrically couple the plurality of drain contacts 110a-110b.

Figure 3:
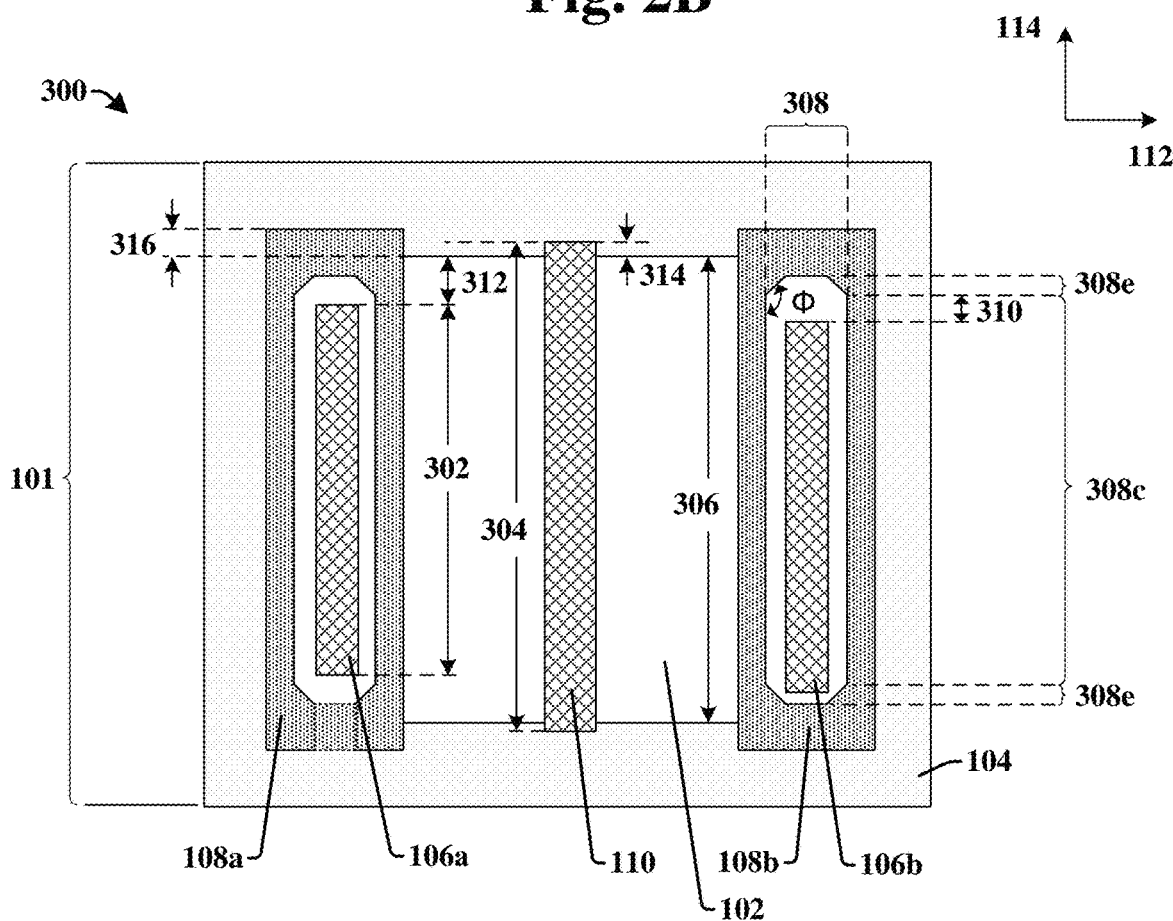
FIG. 3 illustrates a top-view of some embodiments of an integrated chip having a transistor device comprising a disclosed gate structure overlying an active area.

FIG. 3 illustrates a top-view of some embodiments of an integrated chip 300 having a transistor device comprising a disclosed gate structure overlying an active area.

The integrated chip 300 comprises a substrate 101 having an active area 102 surrounded by an isolation region 104. A first source contact 106a, a second source contact 106b, and a drain contact 110 are disposed within the active area 102 and are separated along a first direction 112. A first gate structure 108a is wrapped around the first source contact 106a and a second gate structure 108b is wrapped around the second source contact 106b. In some embodiments, the first gate structure 108a completely wraps around the first source contact 106a along a first unbroken path and the second gate structure 108b completely wraps around the second source contact 106b along a second unbroken path. In other embodiments, one or more of the first gate structure 108a and the second gate structure 108b may partially wrap around the first source contact 106a and the second source contact 106b, respectively. For example, in some embodiments, the first gate structure 108a may continuously wrap around a first end of the first source contact 106a without wrapping around an opposing second end of the first source contact 106a (denoted by dotted line of first gate structure 108a).

In some embodiments, the first source contact 106a and/or the second source contact 106b have a first length 302 and the drain contact 110 has a second length 304 that is greater than the first length 302. In some embodiments, the first length 302 is less than a width 306 of the active area 102, while the second length 304 is greater than the width 306 of the active area 102. In some embodiments, the first source contact 106a and/or the second source contact 106b have an end that is separated from an edge of the isolation region 104 by a first non-zero distance 312. In some embodiments, the drain contact 110 may extend for a second non-zero distance 314 over the isolation region 104. In some embodiments, the first gate structure 108a and/or the second gate structure 108b may extend in the second direction 114 for a third non-zero distance 316 over the isolation region 104. In other embodiments (not shown), the first gate structure 108a and the second gate structure 108b may have ends that are substantially aligned with an edge of the isolation region 104, or that are within the active area 102.

Interior sidewalls of the first gate structure 108a and the second gate structure 108b define an aperture 308 respectively extending through the first gate structure 108a and the second gate structure 108b and exposing the first source contact 106a and the second source contact 106b. In some embodiments, the interior sidewalls of the first gate structure 108a and the second gate structure 108b are separated by an obtuse angle Φ measured outside of the first gate structure 108a and the second gate structure 108b (i.e., measured along a path that does not extend through the first gate structure 108a and the second gate structure 108b). Separating the interior sidewalls of the first gate structure 108a and the second gate structure 108b by an obtuse angle Φ may reduce electric field crowding at interior corners of the first gate structure 108a and the second gate structure 108b. In such embodiments, the aperture 308 may have a central region 308c with a substantially constant width and end regions 308e with widths that decrease as a distance from the central region 308c increases. In some embodiments, the central region 308c may extend past an end of the first source contact 106a for a distance 310. In other embodiments, the aperture 308 may have a substantially constant width along an entirety of the aperture 308.

Figure 4A:
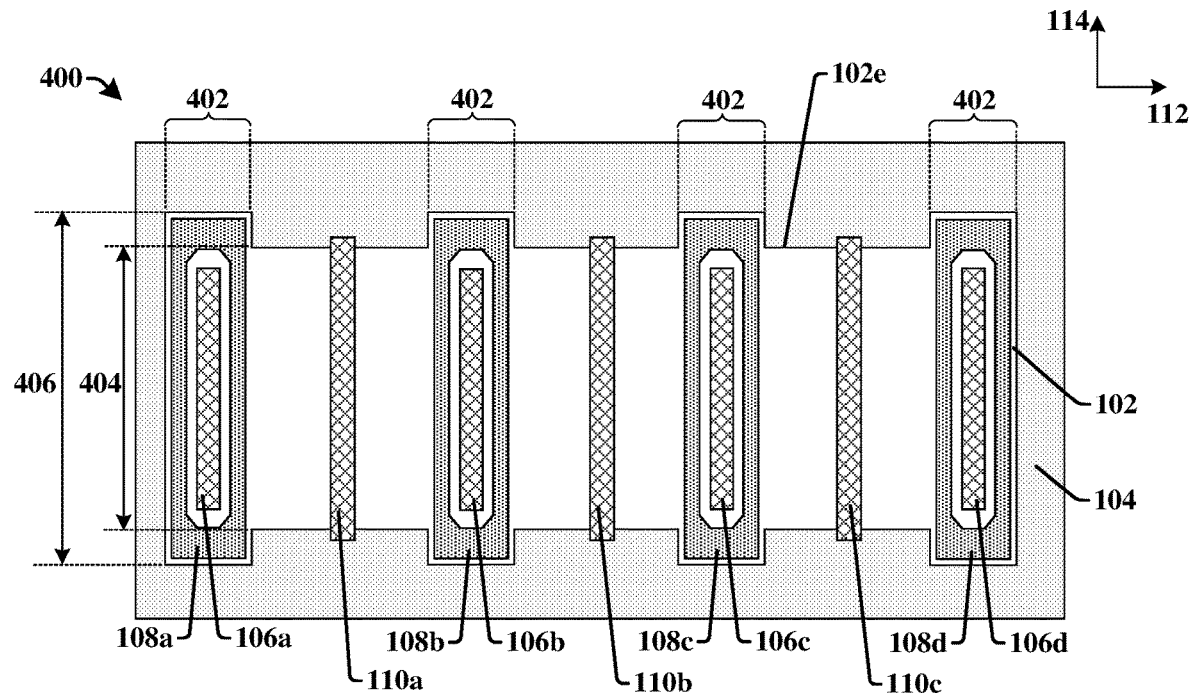
FIGS. 4A-4B illustrate top-views of some embodiments of integrated chips having a transistor device comprising a disclosed gate structure overlying an active area with multiple widths.
Figure 4B:
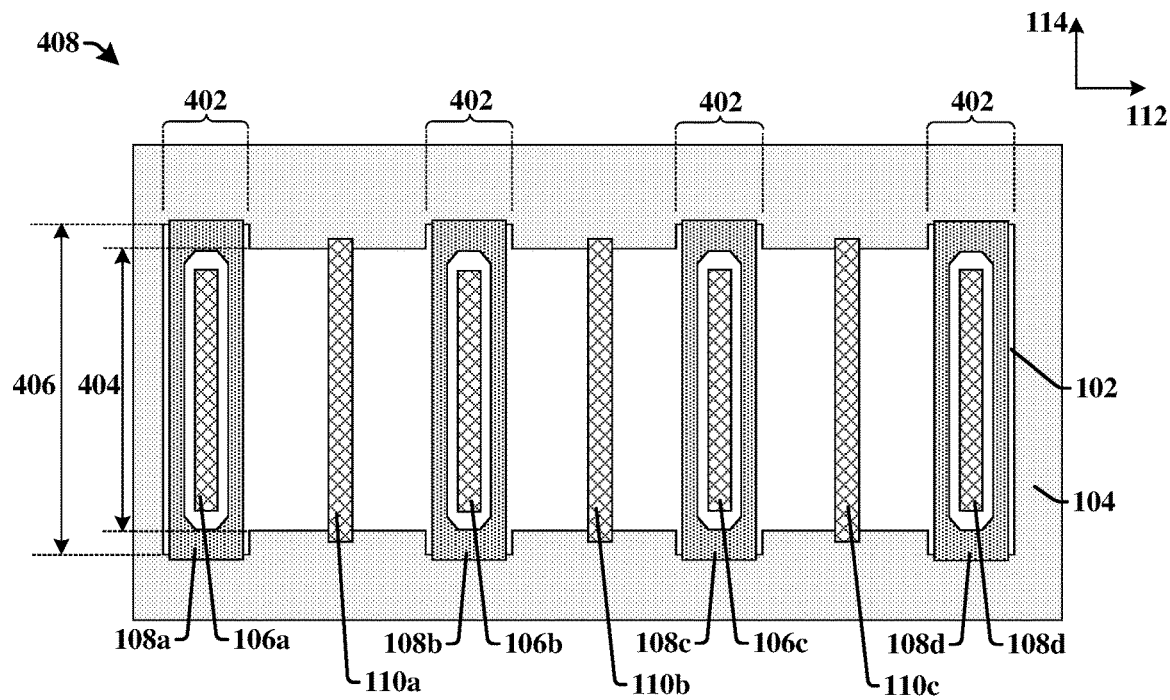

FIGS. 4A-4B illustrate top-views of some embodiments of integrated chips, 400 and 408, having a transistor device comprising a disclosed gate structure overlying an active area having multiple widths.

The integrated chip 400 of FIG. 4A comprises an active area 102 surrounded by an isolation region 104. A plurality of gate structures 108a-108d are disposed over the active area 102 around a plurality of source contacts 106a-106d. The active area 102 comprises active area protrusions 402 that extend outward from an edge 102e of the active area 102. In some embodiments, the active area protrusions 402 may extend outward from opposing edges of the active area 102. The active area protrusions 402 cause the active area 102 to have a greater width below the plurality of gate structures 108a-108d than between the plurality of gate structures 108a-108d and drain contacts 110a-110c. For example, the active area 102 has a first width 404 between a first gate structure 108a and a first drain contact 110a, and a second width 406 below the first gate structure 108a that is greater than the first width 404.

It has been appreciated that an ion implantation process, which may be used to form the isolation region 104, may damage a doped semiconductor material (e.g., p-doped GaN) within the plurality of gate structures 108a-108d. When the doped semiconductor material becomes damaged, it may lose some of its ability to interrupt an underlying 2DEG. By having active area protrusions 402 that extend outward from the edge 102e of the active area 102, damage to the doped semiconductor material (e.g., p-doped GaN) within the plurality of gate structures 108a-108d can be mitigated. By mitigating damage to doped semiconductor material (e.g., p-doped GaN), the plurality of gate structures 108a-108d are able to interrupt the 2DEG along a path that extends around the source contacts 106a-106d, thereby reducing leakage currents between the source contacts 106a-106d and the drain contacts 110a-110c.

In some embodiments, shown in FIG. 4A, the active area 102 may extend past the plurality of gate structures 108a-108d along a first direction 112 and also along a second direction 114 that is perpendicular to the first direction 112. In other embodiments, shown in FIG. 4B, the integrated chip 408 may have parts of the plurality of gate structures 108a-108d that extend past the isolation region 104 along the second direction 114. In such embodiments, at least a part of respective ones of the plurality of gate structures 108a-108d may be outside of the isolation region 104, so that at least a part of the plurality of gate structures 108a-108d is not subjected to damage during formation of the isolation region 104.

Figure 5:
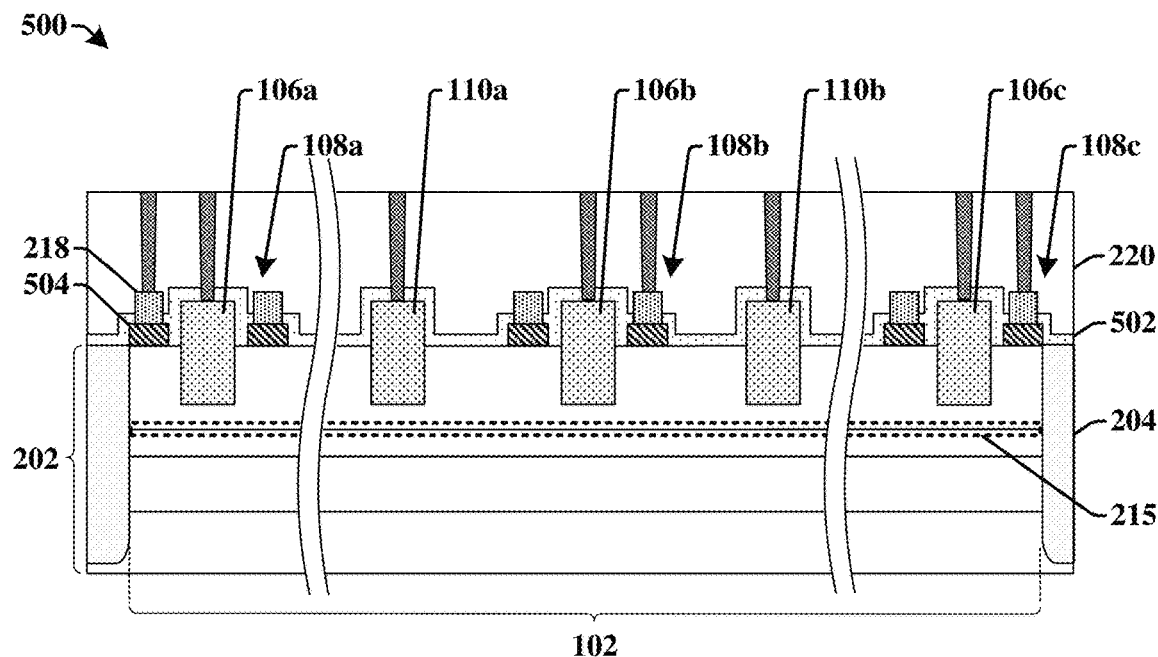
FIGS. 5-6 illustrate some additional embodiments of an integrated chip having a transistor device comprising a plurality of gate structures configured to suppress a leakage current between source and drain contacts.

FIG. 5 illustrates some embodiments of an integrated chip 500 having a high electron mobility transistor (HEMT) device comprising a plurality of gate structures configured to suppress a leakage current between source and drain contacts.

The integrated chip 500 comprises a plurality of source contacts 106a-106c, a plurality of drain contacts 110a-110b, and a plurality of gate structures 108a-108c disposed over an active area 102 within a stacked substrate structure 202. The plurality of gate structures 108a-108c respectively comprise a doped semiconductor material 504 and a gate contact 218 over the doped semiconductor material 504. In some embodiments, the doped semiconductor material 504 may comprise p-doped gallium nitride. In some embodiments, one or more sidewalls of the doped semiconductor material 504 may be laterally offset from one or more sidewalls of the gate contact 218.

A passivation layer 502 extends over the plurality of source contacts 106a-106c and the plurality of drain contacts 110a-110b. The passivation layer 502 also extends over the doped semiconductor material 504 of the plurality of gate structures 108a-108c. The gate contact 218 extends through the passivation layer to contact the doped semiconductor material 504. In various embodiments, the passivation layer 502 may comprise an oxide (e.g., silicon oxide), a nitride (e.g., silicon nitride), or the like.

The active area 102 is surrounded by an isolation region 104. In some embodiments, the isolation region 104 may be completely outside of the plurality of gate structures 108a-108c. In other embodiments (not shown), the isolation region 104 may laterally extend to a non-zero distance below one or more of the plurality of gate structures 108a-108c. In some such embodiments, the isolation region 104 may not extend completely past opposing sidewalls of one or more of the plurality of gate structures 108a-108c. This is because it has been appreciated that the process used to form the isolation region 104 may damage an overlying doped semiconductor material. The damage to the doped semiconductor material reduces an ability of the doped semiconductor material to disrupt an underlying 2DEG 215. Therefore, in such embodiments, a part of the doped semiconductor material 504 directly overlying the isolation region 104 may have a crystalline structure that has more damage than a part of the doped semiconductor material 504 that is outside of the isolation region 104.

Figure 6:
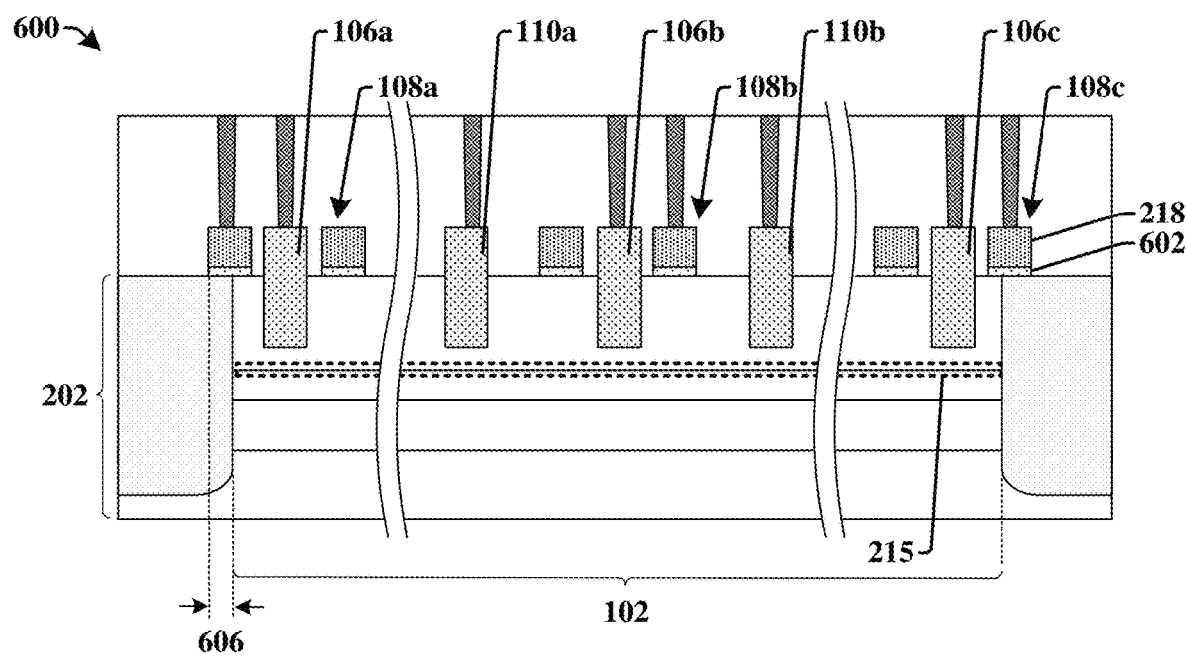

FIG. 6 illustrates some additional embodiments of an integrated chip 600 having a MISFET (metal-insulator-semiconductor field effect transistor) device comprising a plurality of gate structures configured to suppress a leakage current between source and drain contacts.

The integrated chip 600 comprises a plurality of source contacts 106a-106c, a plurality of drain contacts 110a-110b, and a plurality of gate structures 108a-108c disposed over an active area 102 within a stacked substrate structure 202. The plurality of gate structures 108a-108c respectively comprise an insulating material 602 and a gate contact 218 over the insulating material 602. In some embodiments, the insulating material 602 may comprise an oxide (e.g., silicon oxide), a nitride (e.g., silicon nitride), or the like. In some embodiments, sidewalls of the insulating material 602 may be substantially aligned with sidewalls of the gate contact 218.

The active area 102 is surrounded by an isolation region 104. In some embodiments, the isolation region 104 may laterally extend to a non-zero distance 606 below one or more of the plurality of gate structures 108a-108c. For example, in some embodiments, the isolation region 104 may extend below a part of a first gate structure 108a that is disposed along a side of a first source contact 106a that faces away from the active area 102. In some embodiments, the isolation region 104 may extend completely past opposing sidewalls of the plurality of gate structures 108a-108c.

Figure 7A:
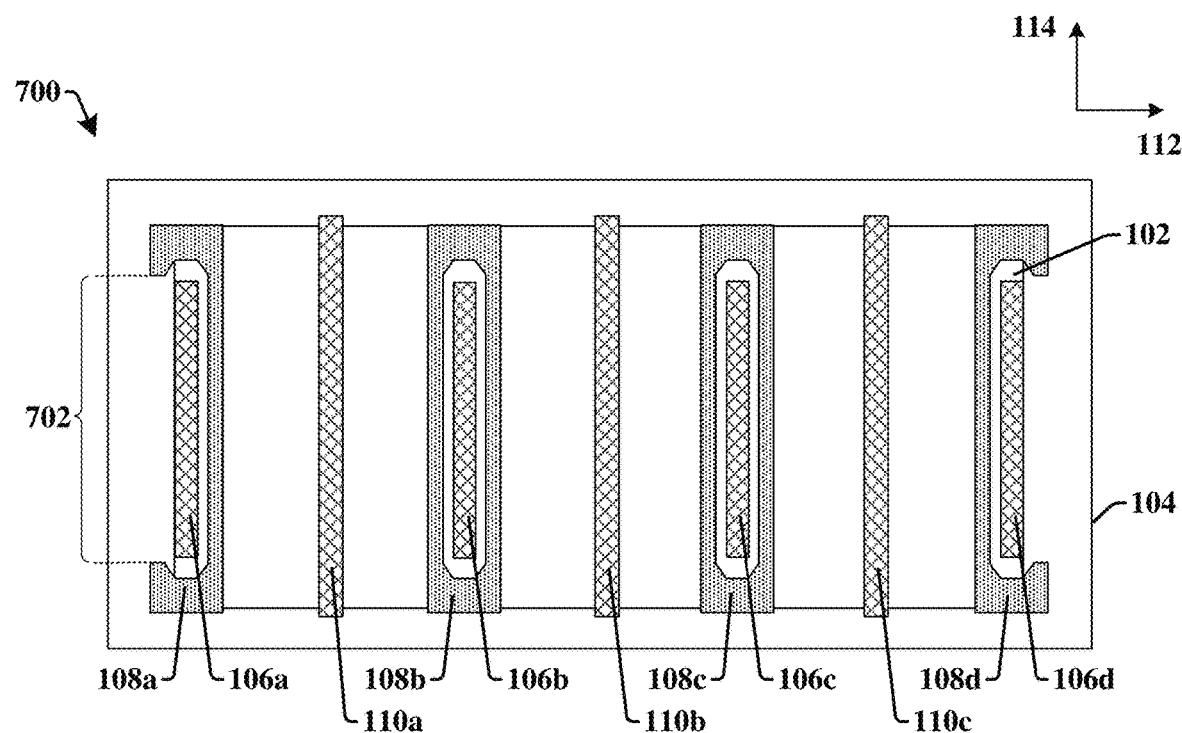
FIGS. 7A-7B illustrate top-views of some alternative embodiments of integrated chips having a transistor device comprising a plurality of gate structures with different shapes.

FIG. 7A illustrates a top-view of some alternative embodiments of an integrated chip 700 having a transistor device comprising a plurality of gate structure configured to suppress a leakage current between source and drain contacts.

The integrated chip 700 comprises a plurality of gate structures 108a-108d disposed within an active area 102 of a substrate 101 and separated along a first direction 112. The plurality of gate structures 108a-108d respectively surround one of a plurality of source contacts 106a-106d and are separated from one another by one of a plurality of drain contact 110a-110c.

The plurality of gate structures 108a-108d comprise a first gate structure 108a disposed along a first end of the active area 102 and a last gate structure 108d disposed along a second end of the active area 102 opposing the first end. The first gate structure 108a and the last gate structure 108d are outermost gate structures (i.e., are at opposing ends of a series of gate structures over the active area 102). The first gate structure 108a is separated from the last gate structure 108d by way of a plurality of central gate structures 108b-108c. In some embodiments, the first gate structure 108a and the last gate structure 108d may have different shapes than the plurality of central gate structures 108b-108c. For example, the first gate structure 108a and/or the last gate structure 108d may have sidewalls that define an opening 702, along an outer edge of the first gate structure 108a and/or the last gate structure 108d, which faces away from the active area 102. Because there is an opening 702 along an outer edge of the first gate structure 108a and/or the last gate structure 108d, the first gate structure 108a and/or the last gate structure 108d do not extend completely around a first source contact 106a and a last source contact 106d, respectively. In contrast, the central gate structures 108b-108c extend in a closed and continuous loop completely around a source contact.

The first gate structure 108a and the last gate structure 108d are able to have different shapes than the plurality of central gate structures 108b-108c because the first gate structure 108a and the last gate structure 108d are not disposed between drain contacts (i.e., drain contacts are not disposed along opposing sides of the first gate structure 108a and the last gate structure 108d) and therefore are subject to less leakage than the plurality of central gate structures 108b-108c. Therefore, leakage current is able to be mitigated even if the first gate structure 108a and/or the last gate structure 108d are not a completely closed loop.

Figure 7B:
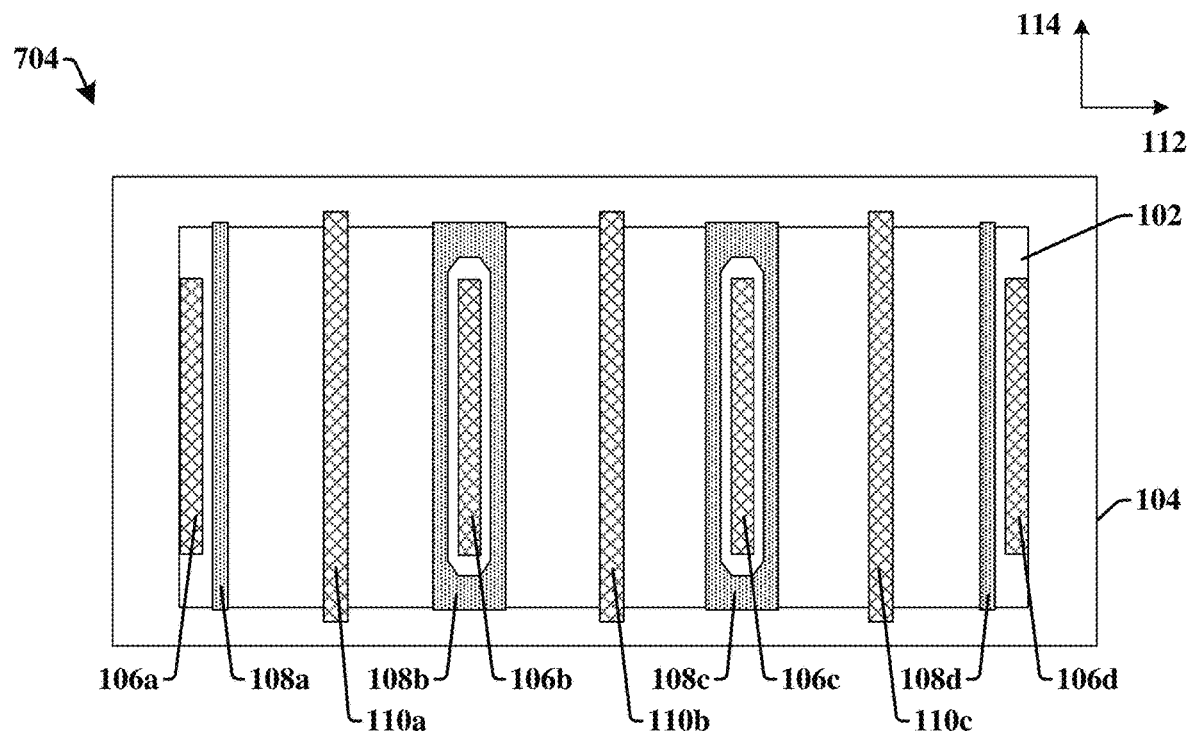

It will be appreciated that in various embodiments, the first gate structure 108a and the last gate structure 108d may have different shapes than those shown in FIG. 7A. For example, FIG. 7B illustrates a top-view of some embodiments of an integrated chip 704 having a first gate structure 108a and a last gate structure 108d that respectively comprise rectangular shaped gate structures as viewed in the top-view. In yet other embodiments (not shown), a first gate structure 108a and a last gate structure 108d wrap around a source contact for distances that are between those shown in FIG. 7A and FIG. 7B. For example, in some embodiments, a first gate structure 108a may have outermost sidewalls that are disposed along a line that extends in the second direction 114 and that intersects the first source contact 106a.

Figure 8:
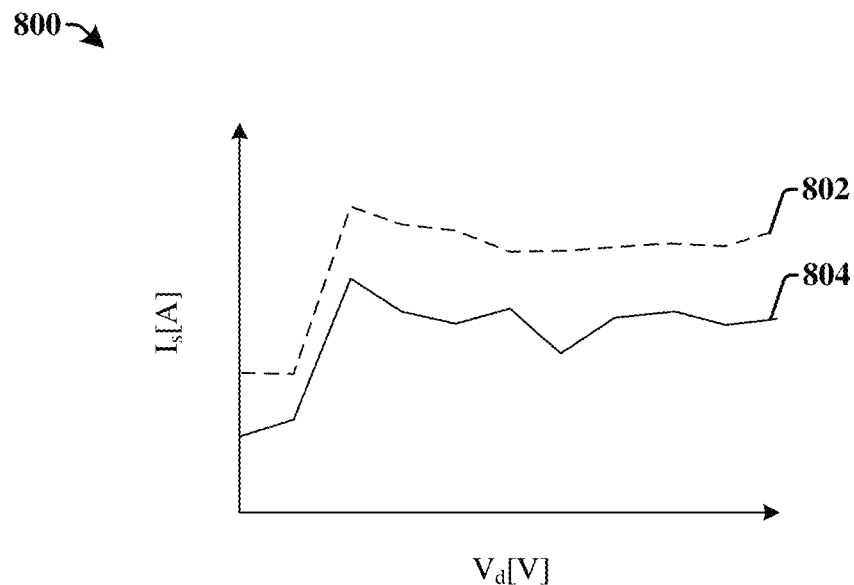
FIG. 8 illustrates a graph showing some embodiments of a source current as a function of drain voltage for a disclosed transistor device.

FIG. 8 illustrates a graph 800 showing some embodiments of a source current as a function of drain voltage for a disclosed transistor device.

Graph 800 illustrates a drain voltage $V_d$ along an x-axis and a source current $I_s$ along a y-axis. The source current of a transistor device having rectangular shaped gate fingers that do not enclose a source contact is shown by line 802. The source current of a transistor device having the disclosed gate structure (e.g., a gate structure that wraps around a source contact as illustrated, for example, in FIG. 1) is shown by line 804. As shown in graph 800, the disclosed gate structure causes the source current (line 804) to be lower than that of a transistor device having rectangular shaped gate fingers (shown by line 802). In some embodiments, the disclosed gate structure may reduce the source current by between approximately 80% and approximately 95% over a transistor device having rectangular shaped gate fingers.

Figure 9:
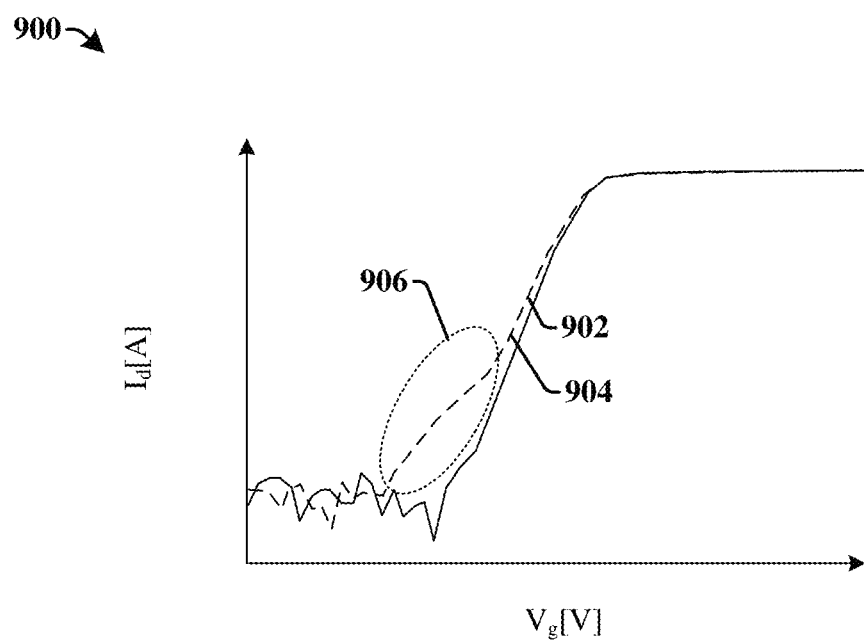
FIG. 9 illustrates a graph showing some embodiments of a drain current as a function of gate voltage for a disclosed transistor device.

FIG. 9 illustrates a graph 900 showing some embodiments of a drain current as a function of gate voltage for a disclosed transistor device.

Graph 900 illustrates a gate voltage $V_g$ along an x-axis and a drain current ($I_d$) along a y-axis. The drain current of a transistor device having rectangular shaped gate fingers that do not enclose a source contact is shown by line 902. The drain current of a transistor device having the disclosed gate structure (e.g., a gate structure that wraps around a source contact as illustrated, for example, in FIG. 1) is shown by line 904. As shown in graph 900, the drain current shown by line 902 has a larger sub-threshold hump 906 than that of the drain current shown by line 904.

FIGS. 10A-19 illustrate some embodiments of a method of forming an integrated chip having a high electron mobility (HEMT) device comprising a gate structure configured to suppress a leakage current between source and drain contacts. Although FIGS. 10A-19 are described in relation to a method, it will be appreciated that the structures disclosed in FIGS. 10A-19 are not limited to such a method, but instead may stand alone as structures independent of the method.

As shown in cross-sectional view 1000 of FIG. 10A and top-view 1006 of FIG. 10B, an epitaxial stack 1002 is formed over a base substrate 208 to define a stacked substrate structure 202. In some embodiments, the epitaxial stack 1002 may comprise an active layer 212 formed over the base substrate 208, a barrier layer 214 formed on the active layer 212, and a doped semiconductor layer 1004 formed on the barrier layer 214. In some embodiments, the epitaxial stack 1002 may further comprise a buffer layer 210 formed onto the base substrate 208 prior to the formation of the active layer 212 to reduce lattice mismatch between the base substrate 208 and the active layer 212.

In various embodiments, the base substrate 208 may comprise silicon, silicon carbide, sapphire, or the like. In some embodiments, the active layer 212 may comprise gallium nitride (GaN), gallium arsenide (GaAs), or the like. In some embodiments, the barrier layer 214 may comprise aluminum gallium nitride (AlGaN), aluminum gallium arsenide (AlGaAs), or the like. In some embodiments, the buffer layer 210 may comprise GaN (having different concentrations of Ga and N than the active layer 212), GaAs (having a different concentrations of Ga and As than the active layer 212), or the like. In some embodiments, the buffer layer 210, the active layer 212, and the barrier layer 214 may be epitaxially grown onto the base substrate 208 by way of chemical vapor deposition processes.

As shown in cross-sectional view 1100 of FIG. 11A and top-view 1106 of FIG. 11B, the doped semiconductor layer (1004 of FIGS. 10A-10B) may be selectively patterned according to a first masking layer 1102. Patterning the doped semiconductor layer results in a doped semiconductor material 504 having a cavity 1108 defined by a plurality of interior sidewalls facing towards the cavity 1108. In some embodiments, the plurality of interior sidewalls extend along a closed and unbroken path that surrounds the cavity 1108.

In some embodiments, the doped semiconductor layer may be selectively patterned by exposing the doped semiconductor layer to a first etchant 1104 according to the first masking layer 1102. In some embodiments, the first masking layer 1102 may comprise a photosensitive material (e.g., photoresist). In various embodiments, the first etchant 1104 may comprise a wet etchant or a dry etchant.

Figure 12B:
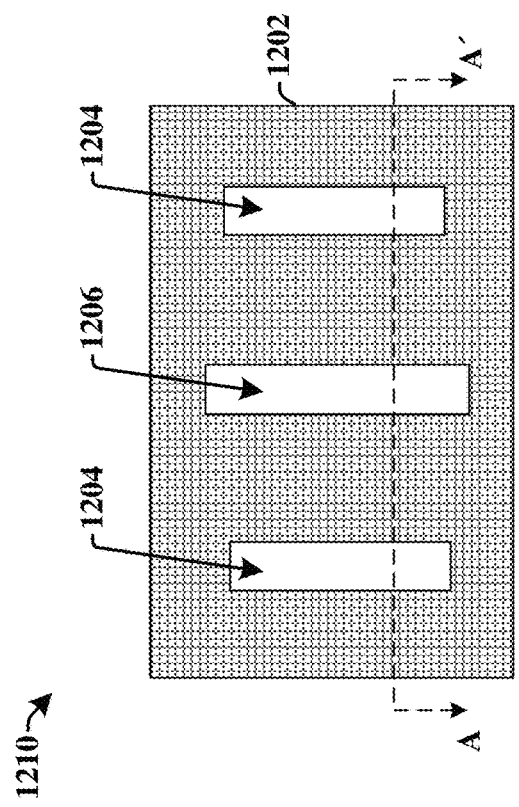
Figure 12A:
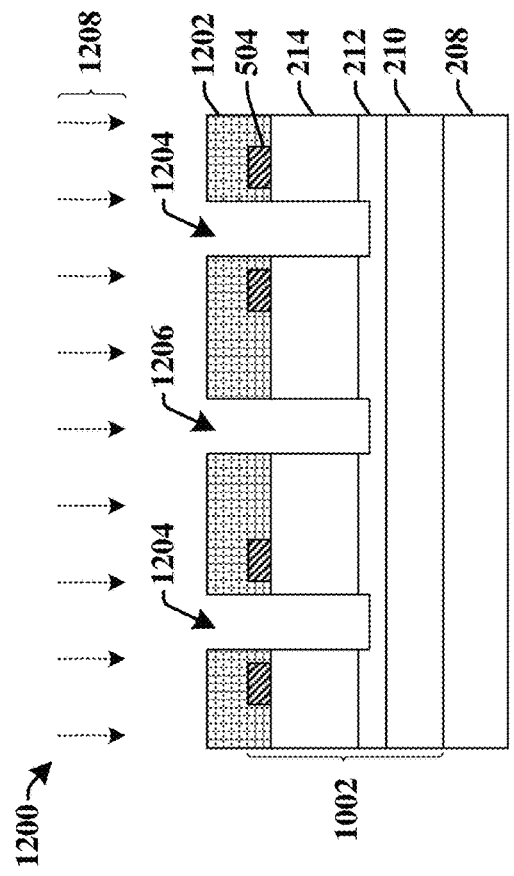

As shown in cross-sectional view 1200 of FIG. 12A and top-view 1210 of FIG. 12B, the epitaxial stack 1002 may be selectively patterned according to a second masking layer 1202 to form one or more source contact recesses 1204 and a drain contact recess 1206, in some embodiments. In some embodiments, the one or more source contact recesses 1204 and the drain contact recess 1206 may extend through the barrier layer 214 and into the active layer 212. In some embodiments, the epitaxial stack 1002 may be selectively patterned by exposing the epitaxial stack 1002 to a second etchant 1208 according to the second masking layer 1202. In some embodiments, the second masking layer 1202 may comprise a photosensitive material (e.g., photoresist). In various embodiments, the second etchant 1208 may comprise a wet etchant or a dry etchant.

Figure 13B:
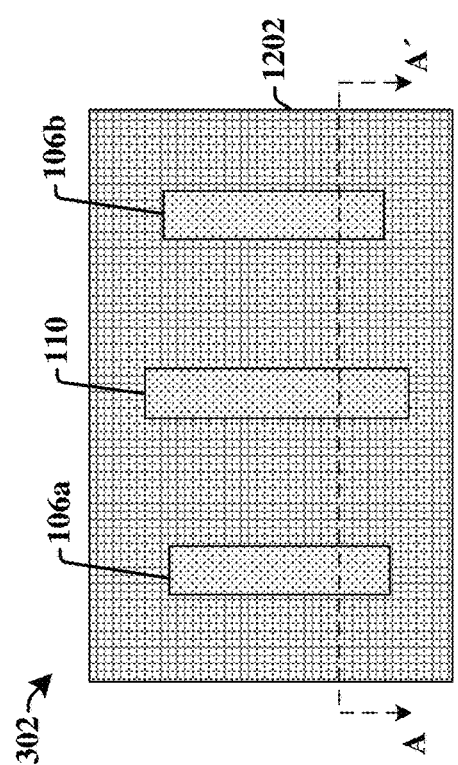
Figure 13A:
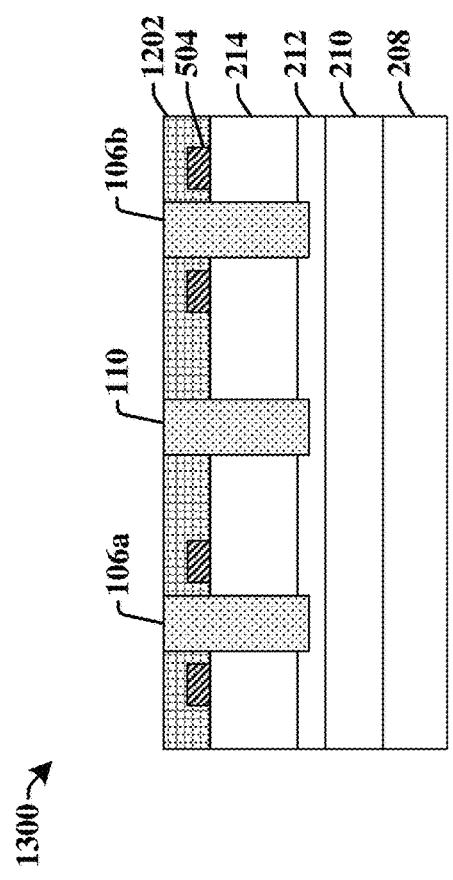

As shown in cross-sectional view 1300 of FIG. 13A and top-view 1302 of FIG. 13B, a conductive material is formed within the one or more source contact recesses 1204 and the drain contact recess 1206 to define one or more source contacts 106a-106b and a drain contact 110. In various embodiments, the conductive material may comprise a metal, such as aluminum, tungsten, titanium, cobalt, or the like. In some alternative embodiments (not shown), the one or more source contacts 106a-106b and the drain contact 110 may be formed over a topmost surface of the barrier layer 214 without forming the one or more source contact recesses and the drain contact recess. In such embodiments, the one or more source contacts 106a-106b and the drain contact 110 have bottommost surfaces that are over the barrier layer 214.

Figure 14A:
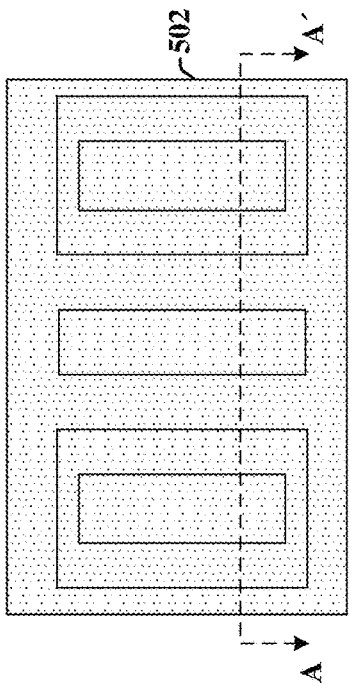
Figure 14B:
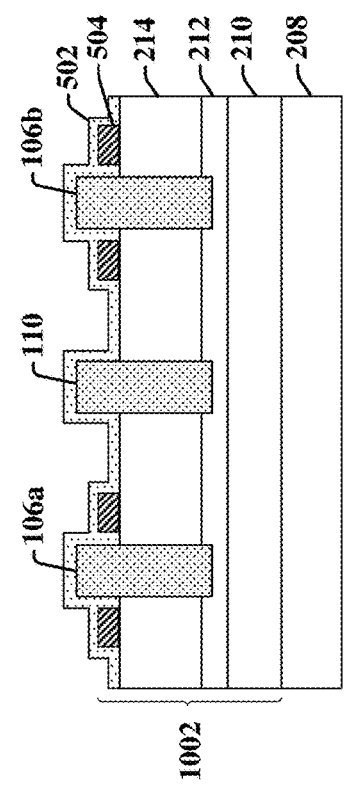

As shown in cross-sectional view 1400 of FIG. 14A and top-view 1402 of FIG. 14B, a passivation layer 502 is formed over the one or more source contacts 106a-106b, the drain contact 110, and the epitaxial stack 1002. In various embodiments, the passivation layer 502 may comprise an oxide (e.g., silicon dioxide), a nitride (e.g., silicon nitride), a carbide (e.g., silicon carbide), or the like. In some embodiments, the passivation layer 502 may be formed by a deposition process (e.g., CVD, PVD, sputtering, PE-CVD, or the like).

Figure 15A:
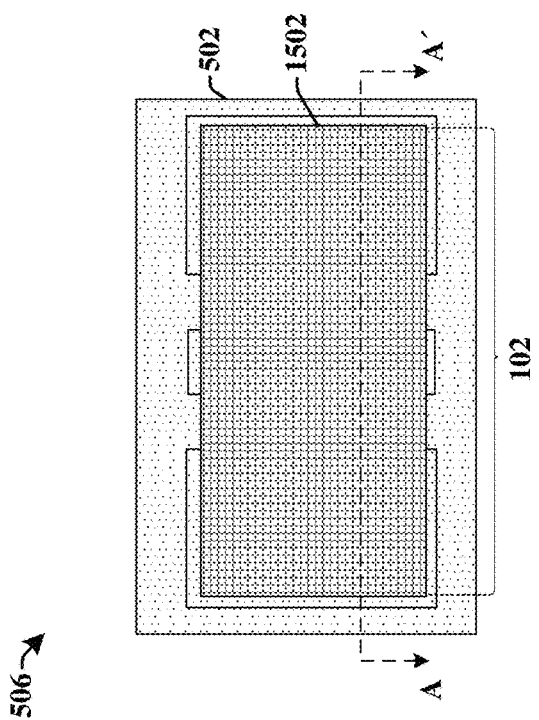
Figure 15B:
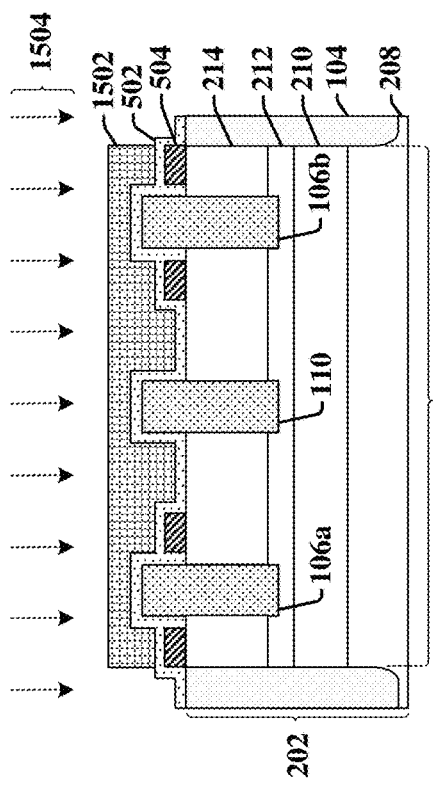

As shown in cross-sectional view 1500 of FIG. 15A and top-view 1506 of FIG. 15B, an active area 102 is defined within the stacked substrate structure 202. The active area 102 is defined to contain the one or more source contacts 106a-106b and the drain contact 110. In some embodiments, the active area 102 may be defined by selectively implanting ions 1504 into the stacked substrate structure 202 according to a third masking layer 1502. The implanted ions 1504 damage the layers of the stacked substrate structure 202. The damage to the layers prevents a 2DEG from extending into the isolation region 104. In some embodiments, the third masking layer 1502 may comprise a photosensitive material (e.g., photoresist).

Figure 16B:
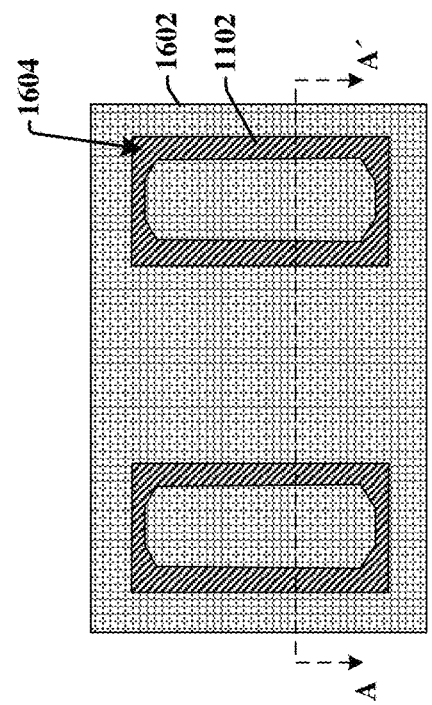
Figure 16A:
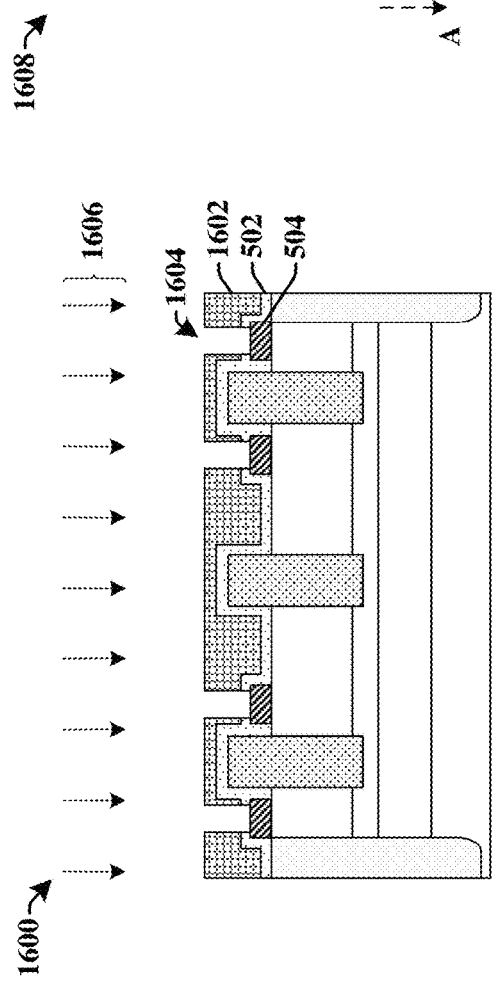

As shown in cross-sectional view 1600 of FIG. 16A and top-view 1608 of FIG. 16B, the passivation layer 502 is selectively patterned to define openings 1604 extending through the passivation layer 502 and exposing the doped semiconductor material 504. In some embodiments, the passivation layer 502 may be selectively patterned by exposing the passivation layer 502 to a third etchant 1606 according to a fourth masking layer 1602. In some embodiments, the fourth masking layer 1602 may comprise a photosensitive material (e.g., photoresist). In various embodiments, the third etchant 1606 may comprise a wet etchant or a dry etchant.

Figure 17B:
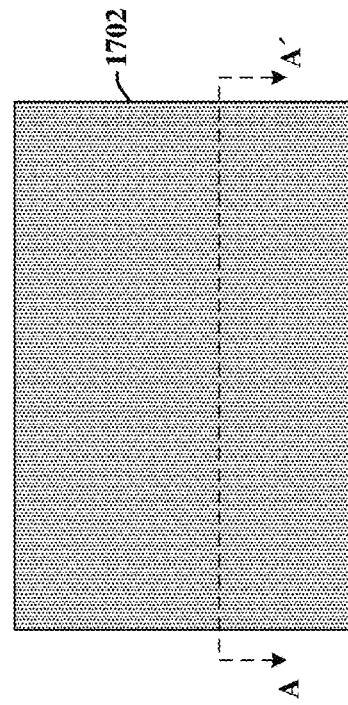
Figure 17A:
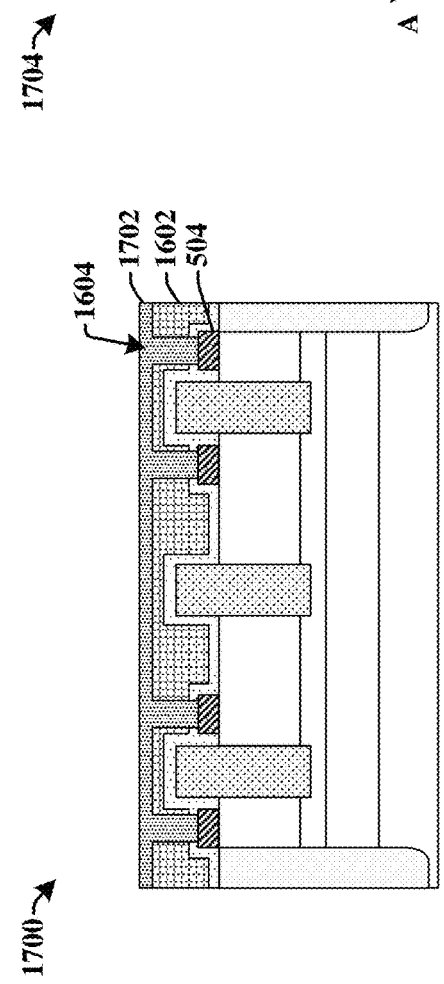

As shown in cross-sectional view 1700 of FIG. 17A and top-view 1704 of FIG. 17B, a gate contact material 1702 is formed in the openings 1604 in the passivation layer 502. In some embodiments, the gate contact material 1702 may comprise a metal such as aluminum, tungsten, cobalt, titanium, or the like. In some embodiments, the gate contact material 1702 may be formed by a deposition process (e.g., CVD, PVD, sputtering, PE-CVD, or the like).

As shown in cross-sectional view 1800 of FIG. 18A and top-view 1802 of FIG. 18B, the gate contact material (1702 of FIGS. 17A-17B) is patterned to define a gate contact 218. The gate contact 218 and the doped semiconductor material 504 collectively define a first gate structure 108a that wraps around the first source contact 106a and a second gate structure 108b that wraps around the second source contact 106b.

As shown in cross-sectional view 1900 of FIG. 19, plurality of conductive contacts 204 are formed within an inter-level dielectric (ILD) layer 220 over the stacked substrate structure 202. In some embodiments, the plurality of conductive contacts 204 may respectively be formed by way of a damascene process. In such embodiments, an ILD layer 220 is formed over the stacked substrate structure 202. The ILD layer 220 is etched to form contacts holes, which are subsequently filled with a conductive material (e.g., tungsten, copper, and/or aluminum). A chemical mechanical planarization (CMP) process is subsequently performed to remove excess of the conductive material from over the ILD layer 220.

Figure 20:
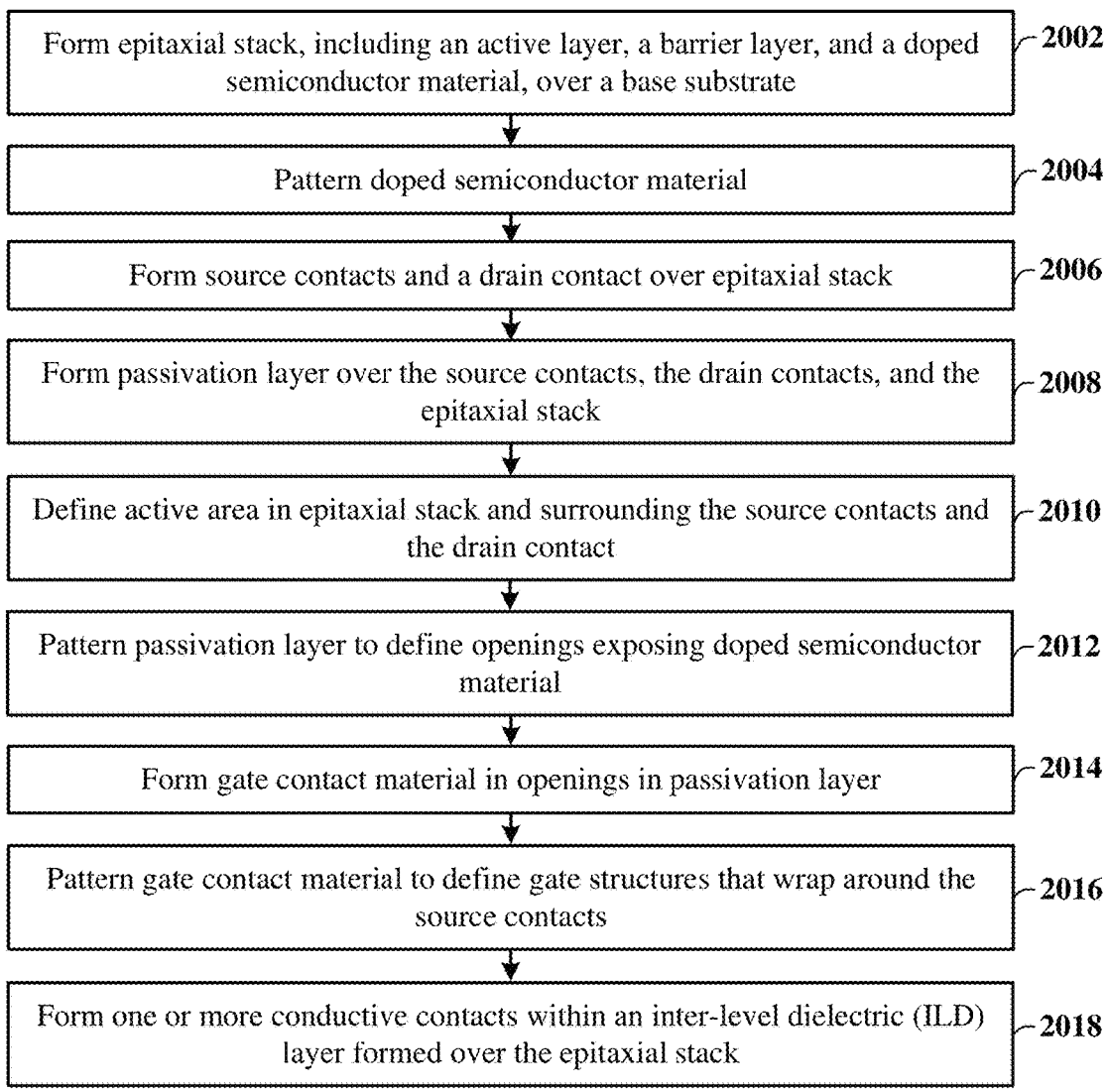
FIG. 20 illustrates a flow diagram of some embodiments of a method of forming an integrated chip having a HEMT device comprising a gate structure configured to suppress a leakage current between source and drain contacts.

FIG. 20 illustrates a flow diagram of some embodiments of a method 2000 of forming an integrated chip having a HEMT device comprising a gate structure configured to suppress a leakage current between source and drain contacts.

While the disclosed methods (e.g., methods 2000 and 2800) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, an epitaxial stack is formed over a base substrate. The epitaxial stack comprises an active layer, a barrier layer over the active layer, and a doped semiconductor material over the barrier layer. FIGS. 10A-10B illustrate a cross-sectional view 1000 and a top-view 1006 of some embodiments corresponding to act 2002.

At 2004, the doped semiconductor material is patterned. FIGS. 11A-11B illustrate a cross-sectional view 1100 and a top-view 1106 of some embodiments corresponding to act 2004.

At 2006, a source contact and a drain contact are formed over the epitaxial stack. FIGS. 12A-13B illustrate cross-sectional views, 1200 and 1300, and top-views, 1210 and 1302, of some embodiments corresponding to act 2006.

At 2008, a passivation layer is formed over the source contacts, the drain contact, and the epitaxial stack. FIGS. 14A-14B illustrate a cross-sectional view 1400 and a top-view 1402 of some embodiments corresponding to act 2008.

At 2010, an active area is defined in the epitaxial stack. The active area surrounds the source contacts and the drain contact. FIGS. 15A-15B illustrate a cross-sectional view 1500 and a top-view 1506 of some embodiments corresponding to act 2010.

At 2012, the passivation layer is patterned to define openings exposing the doped semiconductor material. FIGS. 16A-16B illustrate a cross-sectional view 1600 and a top-view 1608 of some embodiments corresponding to act 2012.

At 2014, a gate contact material is formed in the openings in the passivation layer. FIGS. 17A-17B illustrate a cross-sectional view 1700 and a top-view 1704 of some embodiments corresponding to act 2014.

At 2016, the gate contact material is patterned to define gate structures that wrap around the source contacts. FIGS. 18A-18B illustrate a cross-sectional view 1800 and a top-view 1802 of some embodiments corresponding to act 2016.

At 2018, one or more conductive contacts are formed within an inter-level dielectric (ILD) layer formed over the epitaxial stack. FIG. 19 illustrates a cross-sectional view 1900 of some embodiments corresponding to act 2018.

FIGS. 21A-28 illustrate some embodiments of a method of forming an integrated chip having a MISFET (metal insulator semiconductor field effect transistor) device comprising a gate structure configured to suppress a leakage current between source and drain contacts. Although FIGS. 21A-28 are described in relation to a method, it will be appreciated that the structures disclosed in FIGS. 21A-28 are not limited to such a method, but instead may stand alone as structures independent of the method.

As shown in cross-sectional view 2100 of FIG. 21A and top-view 2104 of FIG. 21B, an epitaxial stack 2102 is formed over a base substrate 208 to define a stacked substrate structure 202. In some embodiments, the epitaxial stack 2102 may comprise an active layer 212 formed over the base substrate 208 and a barrier layer 214 formed on the active layer 212. In some embodiments, the epitaxial stack 2102 may also comprise a buffer layer 210 formed onto the base substrate 208 prior to the formation of the active layer 212 to reduce lattice mismatch between the base substrate 208 and the active layer 212.

As shown in cross-sectional view 2200 of FIG. 22A and top-view 2206 of FIG. 22B, the epitaxial stack 2102 may be selectively patterned according to a first masking layer 2202 to form one or more source contact recesses 1204 and a drain contact recess 1206, in some embodiments. In some embodiments, the one or more source contact recesses 1204 and the drain contact recess 1206 may extend through the barrier layer 214 and into the active layer 212. In some embodiments, the epitaxial stack 2102 may be selectively patterned by exposing the epitaxial stack 2102 to a first etchant 2204 according to the first masking layer 2202. In some embodiments, the first masking layer 2202 may comprise a photosensitive material (e.g., photoresist). In various embodiments, the first etchant 2204 may comprise a wet etchant or a dry etchant.

Figure 23A:
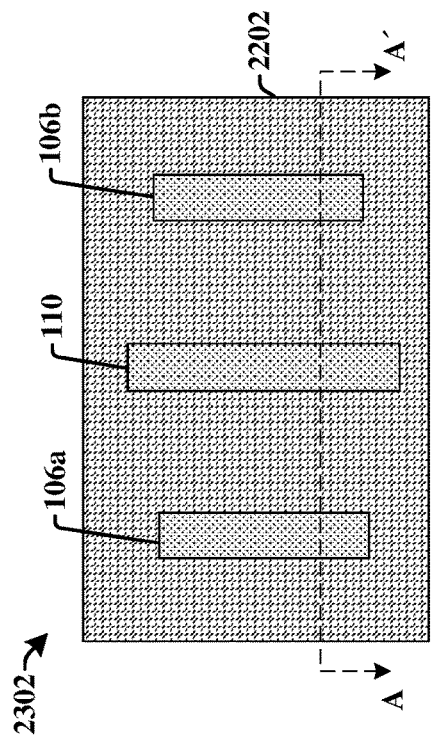
Figure 23B:
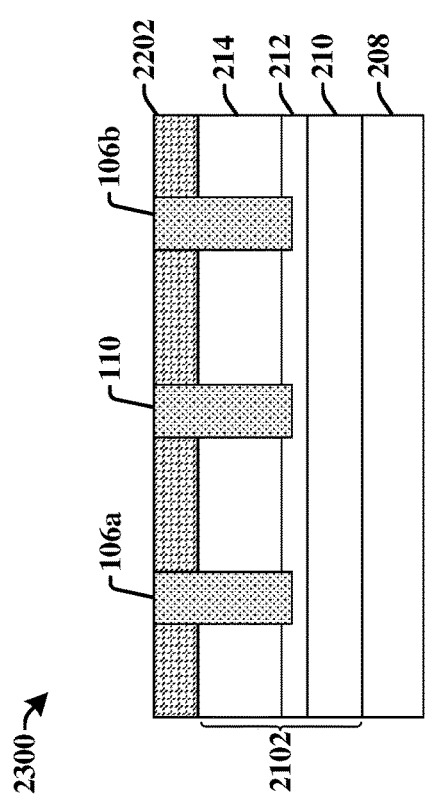

As shown in cross-sectional view 2300 of FIG. 23A and top-view 2302 of FIG. 23B, a conductive material is formed within the one or more source contact recesses 1204 and the drain contact recess 1206 to define one or more source contacts 106a-106b and a drain contact 110. In various embodiments, the conductive material may comprise a metal, such as aluminum, tungsten, titanium, cobalt, or the like. In some alternative embodiments (not shown), the one or more source contacts 106a-106b and the drain contact 110 may be formed over the barrier layer 214 without forming the one or more source contact recesses and the drain contact recess. In such embodiments, the one or more source contacts 106a-106b and the drain contact 110 have bottommost surfaces that are over the barrier layer 214.

Figure 24A:
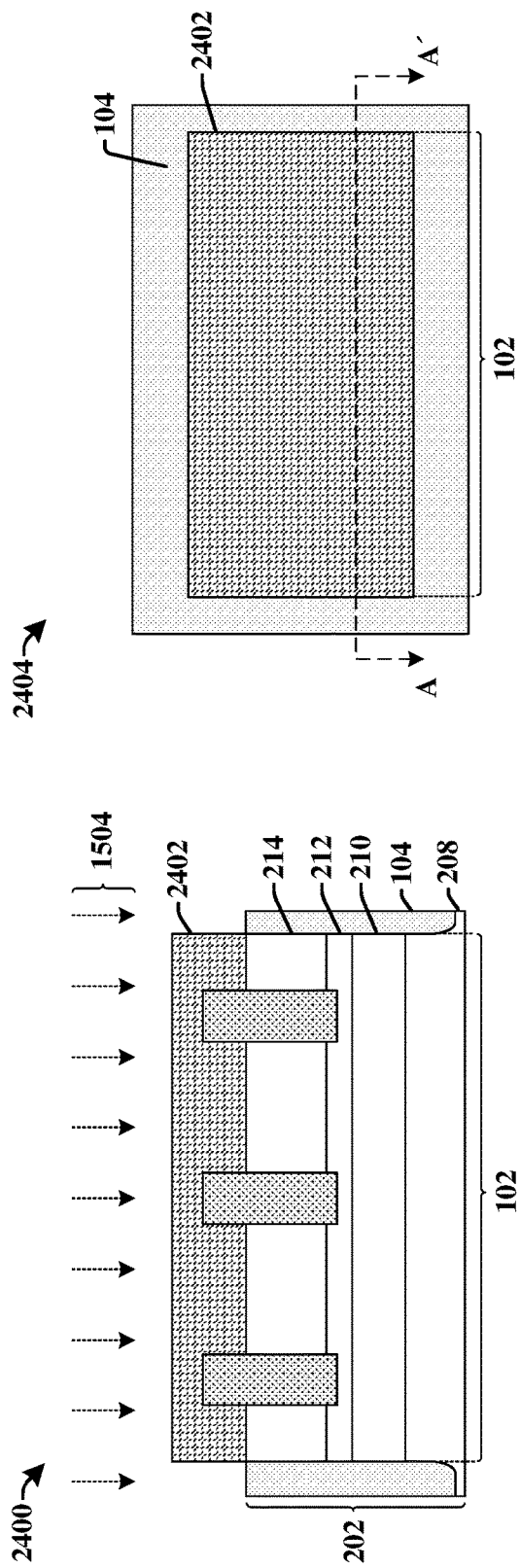
Figure 24B:

As shown in cross-sectional view 2400 of FIG. 24A and top-view 2404 of FIG. 24B, an active area 102 is defined within the stacked substrate structure 202. In some embodiments, the active area 102 may be defined by selectively implanting ions 1504 into the stacked substrate structure 202 according to a second masking layer 2402. The implanted ions 1504 damage the layers of the stacked substrate structure 202. The damage to the layers prevents a 2DEG from extending into the isolation region 104. In some embodiments, the second masking layer 2402 may comprise a photosensitive material (e.g., photoresist).

Figure 25A:
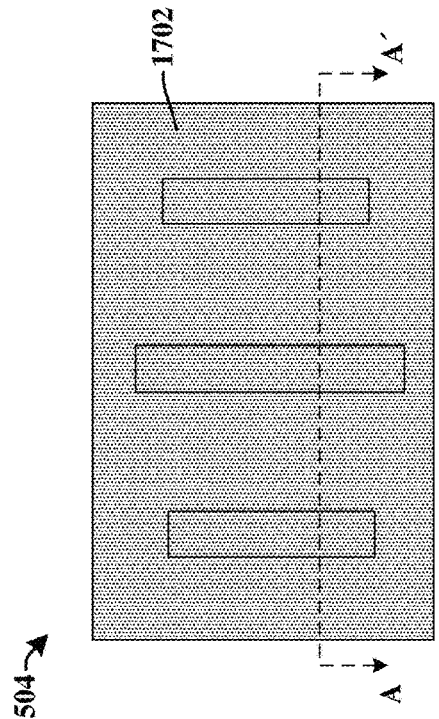
Figure 25B:
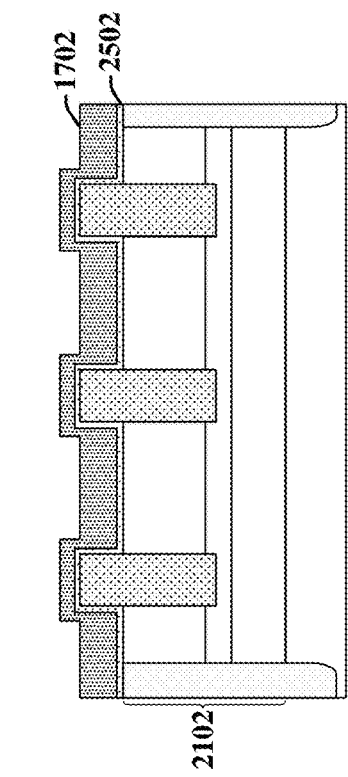

As shown in cross-sectional view 2500 of FIG. 25A and top-view 2504 of FIG. 25B, a gate dielectric layer 2502 and a gate contact material 1702 are formed over the stacked substrate structure 202. In various embodiments, the gate dielectric layer 2502 may comprise an oxide (e.g., silicon dioxide), a nitride (e.g., silicon nitride), or the like. In various embodiments, the gate contact material 1702 may comprise doped polysilicon, a metal (e.g., aluminum, titanium, cobalt, tungsten, or the like), or the like. In some embodiments, the gate dielectric layer 2502 and the gate contact material 1702 may be formed by deposition processes (e.g., CVD, PVD, sputtering, PE-CVD, or the like).

Figure 26A:
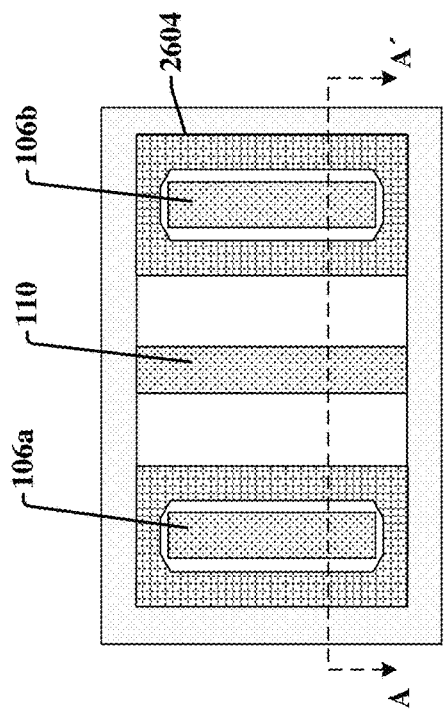
Figure 26B:
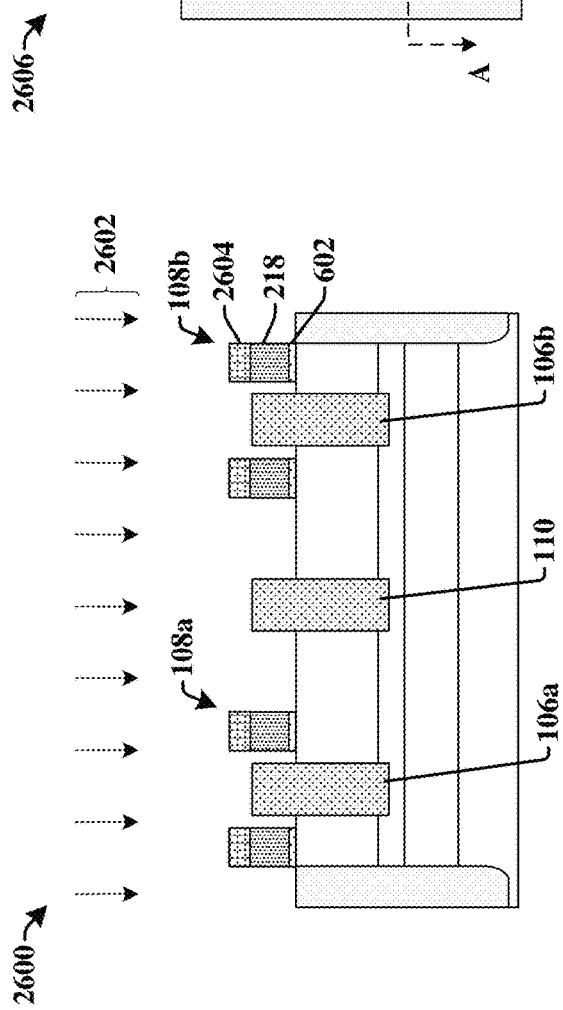

As shown in cross-sectional view 2600 of FIG. 26A and top-view 2606 of FIG. 26B, the gate dielectric layer (2502 of FIG. 25A) and the gate contact material (1702 of FIGS. 25A-25B) is selectively patterned to define a first gate structure 108a that wraps around the first source contact 106a and a second gate structure 108b that wraps around the second source contact 106b. The first gate structure 108a and the second gate structure 108b respectively comprise an insulating material 602 and a gate contact 218 over the insulating material 602. In some embodiments, the gate dielectric layer (2502 of FIG. 25A) and the gate contact material (1702 of FIGS. 25A-25B) may be selectively patterned by exposing the gate dielectric layer and the gate contact material to a third etchant 2602 according to a third masking layer 2604. In some embodiments, the third masking layer 2604 may comprise a photosensitive material (e.g., photoresist). In various embodiments, the third etchant 2602 may comprise a wet etchant or a dry etchant.

Figure 27:
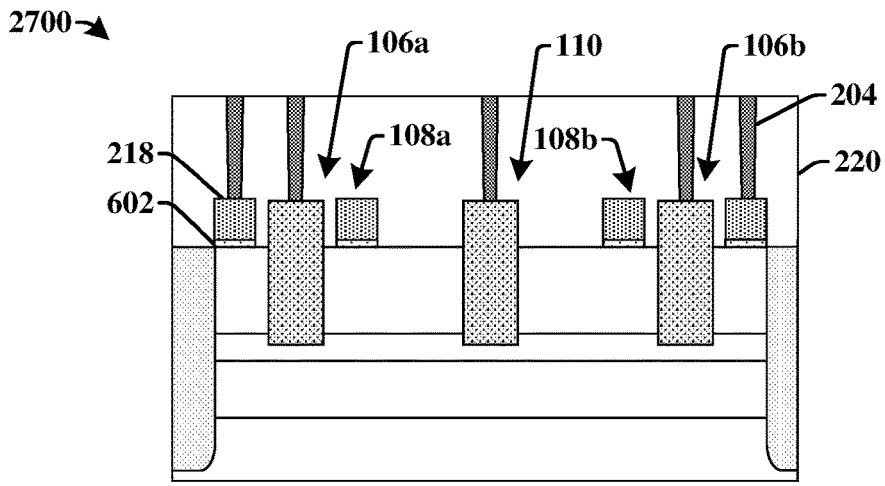

As shown in cross-sectional view 2700 of FIG. 27, a plurality of conductive contacts 204 are formed within an inter-level dielectric (ILD) layer 220 over the stacked substrate structure 202. In some embodiments, the plurality of conductive contacts 204 may respectively be formed by way of a damascene process.

Figure 28:
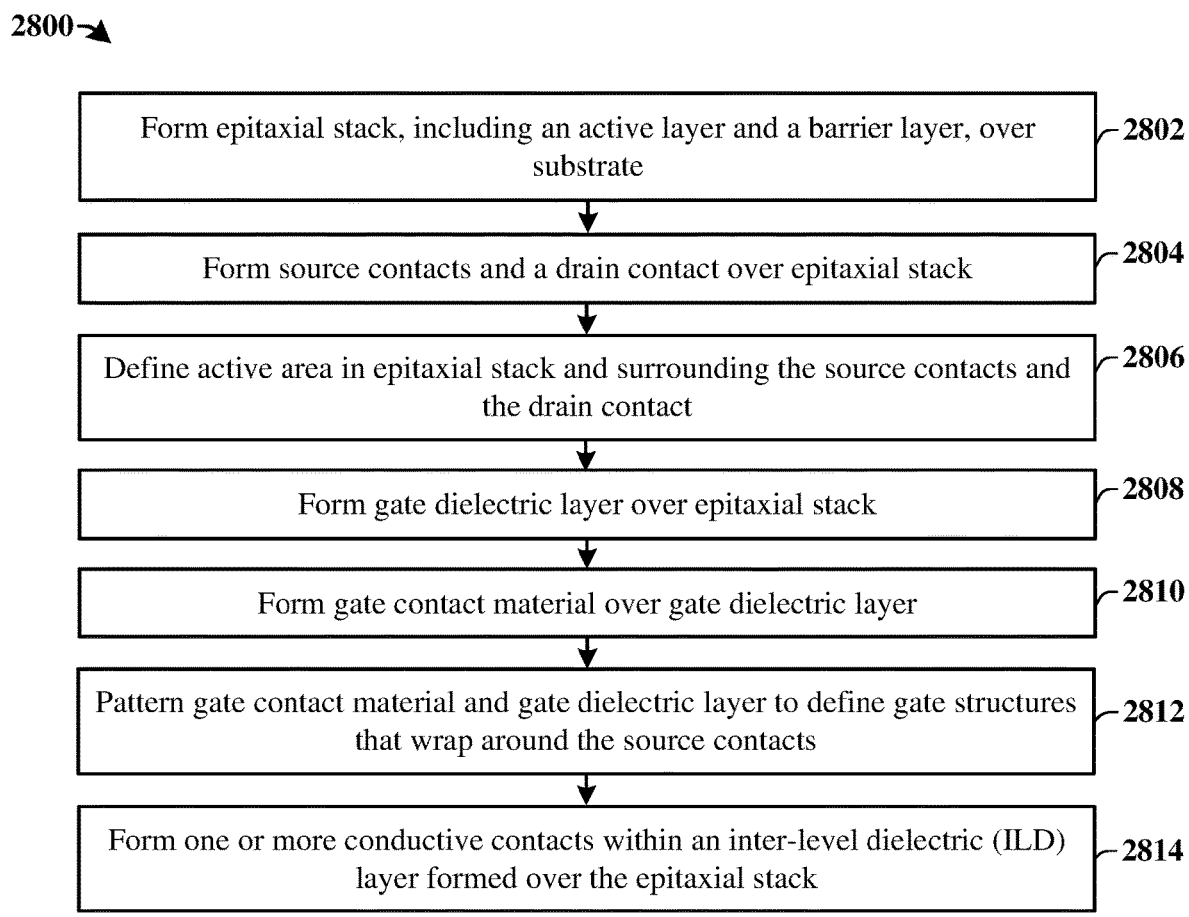
FIG. 28 illustrates a flow diagram of some embodiments of a method of forming an integrated chip having a MISFET device comprising a gate structure configured to suppress a leakage current between source and drain contacts.

FIG. 28 illustrates a flow diagram of some embodiments of a method 2800 of forming an integrated chip having a MISFET device comprising a gate structure configured to suppress a leakage current between source and drain contacts.

At 2802, an epitaxial stack is formed over a substrate. The epitaxial stack comprises an active layer and a barrier layer over the active layer. FIGS. 21A-21B illustrate a cross-sectional view 2100 and a top-view 2104 of some embodiments corresponding to act 2802.

At 2804, source contacts and a drain contact are formed over the epitaxial stack. FIGS. 22A-23B illustrate cross-sectional views, 2200 and 2300, and top-views, 2206 and 2302, of some embodiments corresponding to act 2804.

At 2806, an active area is defined in the epitaxial stack. The active area surrounds the source contacts and the drain contact. FIGS. 24A-24B illustrate a cross-sectional view 2400 and a top-view 2404 of some embodiments corresponding to act 2806.

At 2808, a gate dielectric layer is formed over the epitaxial stack. FIGS. 25A-25B illustrate a cross-sectional view 2500 and a top-view 2504 of some embodiments corresponding to act 2808.

At 2810, a gate contact material is formed over the gate dielectric. FIGS. 25A-25B illustrate a cross-sectional view 2500 and a top-view 2504 of some embodiments corresponding to act 2810.

At 2812, the gate contact material and the gate dielectric layer are patterned to define gate structures that wrap around the source contacts. FIGS. 26A-26B illustrate a cross-sectional view 2600 and a top-view 2606 of some embodiments corresponding to act 2812.

At 2814, one or more conductive contacts are formed within an inter-level dielectric (ILD) layer formed over the epitaxial stack. FIG. 27 illustrates a cross-sectional view 2700 of some embodiments corresponding to act 2814.

Accordingly, in some embodiments, the present disclosure relates to an integrated chip comprising a semiconductor device that has a gate structure that wraps around a source contact to reduce leakage currents between the source contact and a drain contact of a transistor device (e.g., a two-dimensional electron gas base transistor device).

In some embodiments, the present disclosure relates to a transistor device. The transistor device includes a source contact disposed over a substrate, the source contact having a first side and an opposing second side disposed between a first end and an opposing second end; a drain contact disposed over the substrate and separated from the source contact along a first direction; and a gate structure disposed over the substrate between the source contact and the drain contact, the gate structure extends along a first side of the source contact facing the drain contact and also wraps around the first end and the second end of the source contact. In some embodiments, the gate structure extends past the first side and the opposing second side of the source contact along the first direction and past the first end and the opposing second end of the source contact along a second direction that is perpendicular to the first direction. In some embodiments, the gate structure continuously extends around the source contact in a closed and unbroken path. In some embodiments, the transistor device further includes an isolation region disposed within the substrate and defining an active area; the source contact, the drain contact, the gate structure are disposed directly over the active area. In some embodiments, the gate structure has a greater length than the active area along a second direction that is perpendicular to the first direction. In some embodiments, the active area has a first width and a second width larger than the first width, the first width and the second width are measured along a second direction that is perpendicular to the first direction; and the active area has the second width directly under the gate structure. In some embodiments, the active area has the first width between the gate structure and the drain contact. In some embodiments, the active area includes an active area protrusion that extends outward from an edge of the active area, the gate structure disposed directly over the active area protrusion. In some embodiments, the substrate includes an active layer disposed over a base substrate; and a barrier layer disposed over the active layer, a two-dimensional electron gas (2DEG) is present at an interface of the active layer and the barrier layer, and the gate structure disrupts the 2DEG along a closed path extending around the source contact. In some embodiments, the transistor device further includes a second gate structure surrounding a second source contact and separated from the gate structure by the drain contact along the first direction; and a third gate structure surrounding a third source contact and separated from the second gate structure by a second drain contact along the first direction, the second gate structure having a different shape than the third gate structure. In some embodiments, the second gate structure continuously extends in a closed and unbroken path around the second source contact; and the third gate structure has sidewalls that define an opening disposed along a side of the third source contact that faces away from the second source contact.

In other embodiments, the present disclosure relates to an integrated chip. The integrated chip includes a substrate having an active layer and a barrier layer over the active layer; a source contact disposed over the active layer; a drain contact disposed over the active layer; and a gate structure disposed over the barrier layer between the source contact and the drain contact, the gate structure wraps around the source contact along a continuous and unbroken path that encloses the source contact. In some embodiments, the gate structure includes interior sidewalls defining an aperture that extends through the gate structure and that surrounds the source contact. In some embodiments, the aperture has a central region with a substantially constant width and end regions that have widths that decrease as a distance from the central region increases. In some embodiments, the integrated chip further includes a second gate structure surrounding a second source contact and separated from the gate structure by the drain contact; and a third gate structure surrounding a third source contact and separated from the second gate structure by a second drain contact, the second gate structure having a different shape than the third gate structure. In some embodiments, the second gate structure continuously extends in a closed and unbroken path around the second source contact; and the third gate structure does not extend completely around the third source contact. In some embodiments, the drain contact does not completely surround the source contact. In some embodiments, the source contact is separated from the drain contact along a first direction and the source contact has a smaller length than the drain contact along a second direction that is perpendicular to the first direction.

In yet other embodiments, the present disclosure relates to a method of forming a transistor device. The method includes forming a source contact over a substrate; forming a drain contact over the substrate; forming a gate contact material over the substrate; and patterning the gate contact material to define a gate structure that wraps around the source contact along a continuous and unbroken path. In some embodiments, the method further includes forming an epitaxial stack over a base substrate to form the substrate, the epitaxial stack having an active layer, a barrier layer on the active layer, and a doped semiconductor material on the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   a source contact disposed over a substrate, the source contact having a first side and an opposing second side disposed between a first end and an opposing second end;
   a drain contact disposed over the substrate and separated from the source contact along a first direction;
   a gate structure disposed over the substrate between the source contact and the drain contact, wherein the gate structure extends along the first side of the source contact facing the drain contact and also wraps around the first end and the opposing second end of the source contact;
   an isolation region disposed within the substrate and wrapping around an active area in a closed and unbroken loop, wherein a part of the drain contact is directly over the isolation region; and
   wherein outermost edges of the drain contact continuously extend in closed loop around an outermost perimeter of the drain contact, the outermost edges being laterally confined between the gate structure and a closest neighboring separate gate structure.

2. The transistor device of claim 1, wherein the gate structure extends past the first side and the opposing second side of the source contact along the first direction and past the first end and the opposing second end of the source contact along a second direction that is perpendicular to the first direction.

3. The transistor device of claim 1, wherein the closest neighboring separate gate structure wraps around a part, but not all, of a second source contact.

4. The transistor device of claim 1, wherein a part of the gate structure is directly over the isolation region.

5. The transistor device of claim 1, wherein the substrate comprises:
   an active layer disposed over a base substrate; and
   a barrier layer disposed over the active layer, wherein a two-dimensional electron gas (2DEG) is present at an interface of the active layer and the barrier layer, the gate structure disrupting the 2DEG along a closed path extending around the source contact.

6. The transistor device of claim 1, wherein an outermost sidewall of the drain contact extends past an outermost sidewall of the gate structure in a second direction that is perpendicular to the first direction.

7. The transistor device of claim 6,
   wherein the closest neighboring separate gate structure has sidewalls that define an opening disposed along a side of a second source contact that faces away from the source contact.

8. The transistor device of claim 1, wherein outermost edges of the gate structure continuously extend in closed loop around an outermost perimeter of the gate structure, the outermost edges being laterally confined between the drain contact and a closest neighboring drain contact.

9. An integrated chip, comprising:
   a substrate comprising an active layer and a barrier layer over the active layer;
   a source contact disposed over the active layer;
   a drain contact disposed over the active layer;
   a gate structure disposed over the barrier layer and directly between the source contact and the drain contact along a first direction, wherein the gate structure wraps around the source contact along a continuous and unbroken path that encloses the source contact;
   an isolation region disposed within the substrate and wrapping around an active area in a closed and unbroken loop, wherein the gate structure is directly between the source contact and the isolation region along a second direction that is perpendicular to the first direction in a plan view and wherein the drain contact extends past opposing ends of the source contact in the second direction; and
   a second gate structure surrounding a second source contact and separated from the gate structure by the drain contact, wherein the active area continuously extends between a first outermost sidewall of the gate structure and a second outermost sidewall of the second gate structure that faces the first outermost sidewall.

10. The integrated chip of claim 9, wherein the gate structure continuously extends from directly over the active area to opposing outermost sidewalls that are directly over the isolation region.

11. The integrated chip of claim 9, wherein the isolation region comprises a region of the substrate having crystalline damage.

12. The integrated chip of claim 9, wherein the first outermost sidewall of the gate structure is separated from the second outermost sidewall of the second gate structure by a non-zero distance; and
   wherein a third gate structure surrounds a third source contact and is separated from the second gate structure by a second drain contact, the second gate structure having a different shape than the third gate structure.

13. The integrated chip of claim 9, wherein the isolation region has an edge that extends in the first direction from directly below the drain contact to directly below the gate structure.

14. The integrated chip of claim 9, wherein the drain contact continuously extends along the second direction past opposing outermost sidewalls of the gate structure.

15. An integrated chip, comprising:
   an isolation region disposed within a substrate and wrapping around an active area in a closed loop;
   a source contact disposed over the active area;
   a drain contact disposed over the active area;
   a gate structure disposed over the active area between the source contact and the drain contact, wherein the gate structure extends around the source contact in a closed path having an outermost sidewall that is directly between the source contact and the drain contact; and
   wherein the outermost sidewall of the gate structure extends from directly over the active area to directly over the isolation region.

16. The integrated chip of claim 15, wherein the gate structure has a rectangular shaped outermost perimeter that extends to directly over the isolation region as viewed in a top-view.

17. The integrated chip of claim 15, further comprising:
   a second gate structure disposed over the active area between a second source contact and the drain contact, wherein the second gate structure extends around the second source contact in a second closed path; and
   wherein the outermost sidewall of the gate structure faces a second outermost sidewall of the second gate structure and is separated from the second outermost sidewall by a non-zero distance.

18. The integrated chip of claim 15, wherein the drain contact has a uniform width.

19. The integrated chip of claim 15, wherein the isolation region comprises a region of the substrate having crystalline damage.

20. The integrated chip of claim 15, further comprising:
   a second gate structure surrounding a second source contact and being separated from the gate structure by the drain contact along a first direction, wherein the second gate structure comprises a pair of sidewalls that are entirely arranged along a same side of the second gate structure, the pair of sidewalls extending in the first direction and being separated by a non-zero distance along a second direction perpendicular to the first direction.

* * * * *